United States Patent
Chang et al.

(10) Patent No.: US 10,727,231 B2
(45) Date of Patent: Jul. 28, 2020

(54) HETEROGENEOUSLY INTEGRATED SEMICONDUCTOR DEVICE AND MANUFACTURING METHOD THEREOF

(71) Applicants: National Applied Research Laboratories, Taipei (TW); EPISTAR Corporation, Hsinchu (TW)

(72) Inventors: Shih-Pang Chang, Hsinchu (TW);
Guang-Li Luo, Hsinchu (TW);
Szu-Hung Chen, Hsinchu (TW);
Wen-Kuan Yeh, Hsinchu (TW);
Jen-Inn Chyi, Hsinchu (TW);
Meng-Yang Chen, Hsinchu (TW);
Rong-Ren Lee, Hsinchu (TW);
Shih-Chang Lee, Hsinchu (TW);
Ta-Cheng Hsu, Hsinchu (TW)

(73) Assignees: National Applied Research Laboratories, Taipei (TW); EPISTAR Corporation, Hsinchu (TW)

(*) Notice: Subject to any disclaimer, the term of this patent is extended or adjusted under 35 U.S.C. 154(b) by 0 days.

(21) Appl. No.: 16/159,541

(22) Filed: Oct. 12, 2018

(65) Prior Publication Data

US 2019/0043862 A1 Feb. 7, 2019

Related U.S. Application Data

(63) Continuation of application No. 15/632,391, filed on Jun. 26, 2017, now Pat. No. 10,134,735.

(Continued)

(51) Int. Cl.
*H01L 29/16* (2006.01)
*H01L 29/20* (2006.01)
*H01L 29/161* (2006.01)
*H01L 27/092* (2006.01)
*H01L 29/78* (2006.01)
*H01L 29/66* (2006.01)
*H01L 21/8238* (2006.01)

(52) U.S. Cl.
CPC .. *H01L 27/0924* (2013.01); *H01L 21/823821* (2013.01); *H01L 29/16* (2013.01); *H01L 29/20* (2013.01); *H01L 29/66795* (2013.01); *H01L 29/7853* (2013.01); *H01L 29/161* (2013.01)

(58) Field of Classification Search
CPC ......... H01L 21/823821; H01L 27/0924; H01L 29/1054; H01L 29/26–267
See application file for complete search history.

(56) References Cited

U.S. PATENT DOCUMENTS 8,969,156 B2 3/2015 Wu et al.
9,082,616 B2 7/2015 Merckling
(Continued)

FOREIGN PATENT DOCUMENTS

EP 2741320 A1 6/2014
TW 201541638 A 11/2015
TW 201604929 A 2/2016

*Primary Examiner* — Daniel P Shook

(57) ABSTRACT

A heterogeneously integrated semiconductor device includes a substrate comprising a first material; a recess formed within the substrate and having a bottom portion with a first width, a top portion with a second width and a middle portion with a third width larger than the first width and the second width; and a first semiconductor layer filled in the bottom portion and including a second material different from the first material.

20 Claims, 32 Drawing Sheets

Related U.S. Application Data

(60) Provisional application No. 62/354,427, filed on Jun. 24, 2016.

(56) References Cited

U.S. PATENT DOCUMENTS

| | | |
|---|---|---|
| 9,412,871 B2 | 8/2016 | Doornbos et al. |
| 2012/0032234 A1 | 2/2012 | Wang et al. |
| 2012/0038024 A1 | 2/2012 | Botula et al. |
| 2013/0168771 A1 | 7/2013 | Wu et al. |
| 2015/0206965 A1 | 7/2015 | Cheng et al. |
| 2015/0279947 A1 | 10/2015 | Waldron et al. |
| 2016/0064289 A1* | 3/2016 | Xiao .................. H01L 21/8258 257/369 |

* cited by examiner

| Position | $d_{\{002\}}$ (nm) | $d_{\{111\}}$ (nm) |
|----------|--------------------|--------------------|
| 1 | 0.297 | 0.336 |
| 2 | 0.287 | 0.334 |
| 3 | 0.287 | 0.329 |
| 4 | 0.284 | 0.328 |
| 5 | 0.283 | 0.328 |
| 6 | 0.282 | 0.324 |

…

HETEROGENEOUSLY INTEGRATED SEMICONDUCTOR DEVICE AND MANUFACTURING METHOD THEREOF

CROSS REFERENCE TO RELATED APPLICATIONS

This application is a Continuation of application Ser. No. 15/632,391, filed on Jun. 26, 2017, which claims priority from Provisional Application No. 62/354,427 filed on Jun. 24, 2016, the entire contents of all of which are hereby incorporated by reference.

FIELD OF THE INVENTION

The invention relates to a semiconductor device, and more particularly to a semiconductor device integrating heterogeneous semiconductor device.

BACKGROUND OF THE INVENTION

Semiconductor components have been miniaturized to an extreme. The traditional Moore's Law is difficult to apply due to components encountered physical limits. In this post-silicon era, line width shrink has been unable to meet the metal-oxide semiconductor field effect transistor (MOSFET) development. Group III-V and germanium (Ge) semiconductors have the highest electron and hole mobility, respectively. The successful heterogeneous integration of the Group III-V and the germanium semiconductors on the Si substrate will be the important technologies for future development of CMOS comprising N-type MOSFET (NMOSFET) and P-type MOSFET (PMOSFET).

The information disclosed in this "BACKGROUND OF THE INVENTION" Section is only for enhancement understanding of the background of the invention and therefore it may contain information that does not form the prior art that is already known to a person of ordinary skill in the art. Furthermore, the information disclosed in this "BACKGROUND OF THE INVENTION" section does not mean that one or more problems to be solved by one or more embodiments of the invention were acknowledged by a person of ordinary skill in the art.

SUMMARY OF THE INVENTION

A heterogeneously integrated semiconductor device includes a substrate comprising a first material; a recess formed within the substrate and having a bottom portion with a first width, a top portion with a second width and a middle portion with a third width larger than the first width and the second width; and a first semiconductor layer filled in the bottom portion and including a second material different from the first material.

In a preferred embodiment of the present invention, the heterogeneously integrated semiconductor device further includes a second semiconductor layer on the first semiconductor layer having a third material different from the second material In a preferred embodiment of the present invention, the third material is different from the first material.

In a preferred embodiment, the first material includes Si or Ge.

In a preferred embodiment, the heterogeneously integrated semiconductor devices further includes an insulating layer on the substrate, and the insulating layer comprises a fourth material different from the first material and the second material.

In a preferred embodiment, the first semiconductor layer physically contacts the insulating layer.

In a preferred embodiment, the insulating layer includes a trench connectedly adjacent to the recess.

In a preferred embodiment, the insulating layer includes an upper surface away from the substrate, and the trench includes a bottom opening connectedly adjacent to the recess and a top opening on the upper surface, and the top opening is greater than the bottom opening.

In a preferred embodiment, the trench includes an inner diameter gradually decreased from the top opening to the bottom opening.

In a preferred embodiment, the first semiconductor layer filled in the middle portion and the top portion of the recess.

In a preferred embodiment, the first material and the second material comprises a same element.

In a preferred embodiment, the third material and the first material comprises a same element.

In a preferred embodiment, the first semiconductor layer filled in the trench.

In a preferred embodiment, the first semiconductor layer includes a top surface away from the substrate, and the insulating layer includes an upper surface away from the substrate and below the top surface.

In a preferred embodiment, the second semiconductor layer has a dislocation density less than that of the first semiconductor layer.

In a preferred embodiment, the heterogeneously integrated semiconductor device further include a second semiconductor layer filled in the trench, and wherein the second semiconductor layer includes a third material different from the second material.

In a preferred embodiment, the heterogeneously integrated semiconductor device further includes an insulating layer in the substrate.

In a preferred embodiment, the insulating layer includes oxygen or nitrogen.

In a preferred embodiment, the trench has a fourth width adjacent to the recess, and the fourth width is smaller than the third width of the middle portion.

In a preferred embodiment, the trench has a fourth width adjacent to the recess, and the fourth width is smaller than the second width of the top portion. The above and other objects, features and advantages of the present invention will become more apparent from the following detailed description taken in conjunction with the accompanying drawings in which:

BRIEF DESCRIPTION OF THE DRAWINGS

FIG. 2E' is a schematic diagram of a configuration of a heterogeneously integrated semiconductor device according to an embodiment of the present invention.

DETAILED DESCRIPTION OF PREFERRED EMBODIMENTS

Figure 1A:
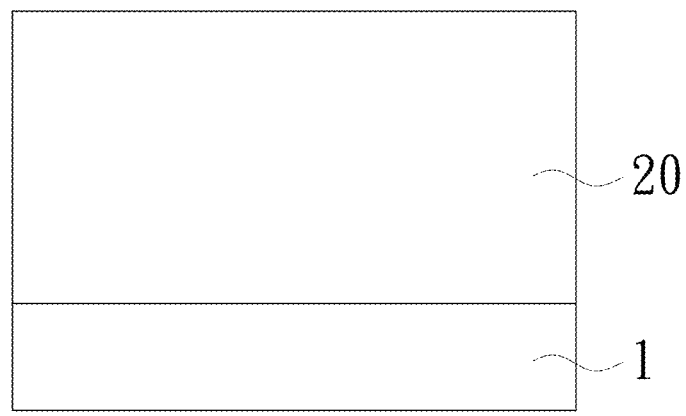
FIGS. 1A-1H are schematic diagrams of manufacturing processes of a heterogeneously integrated semiconductor device according to an embodiment of the present invention.
Figure 1B:
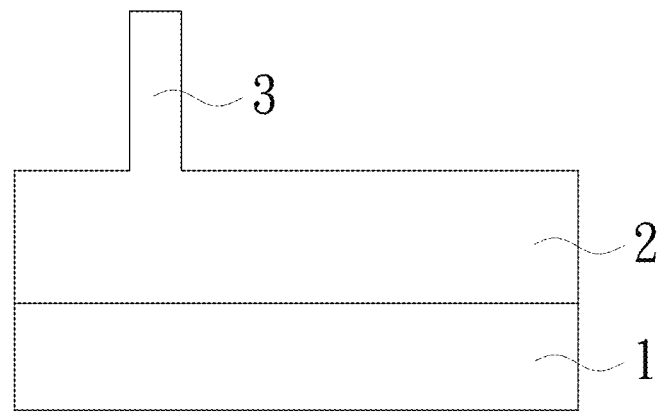
Figure 1C:
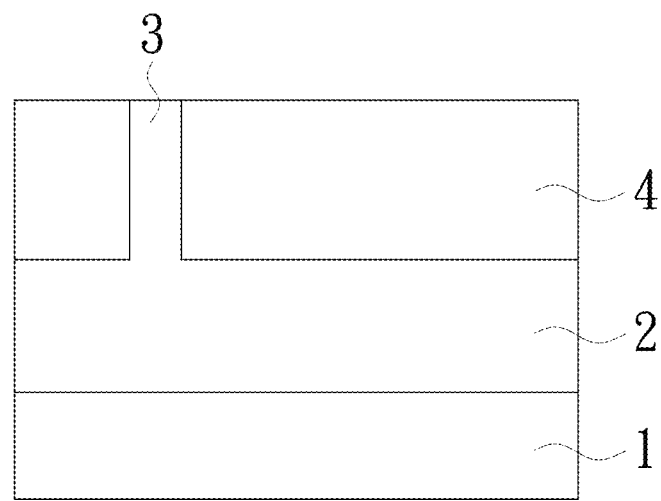
Figure 1D:
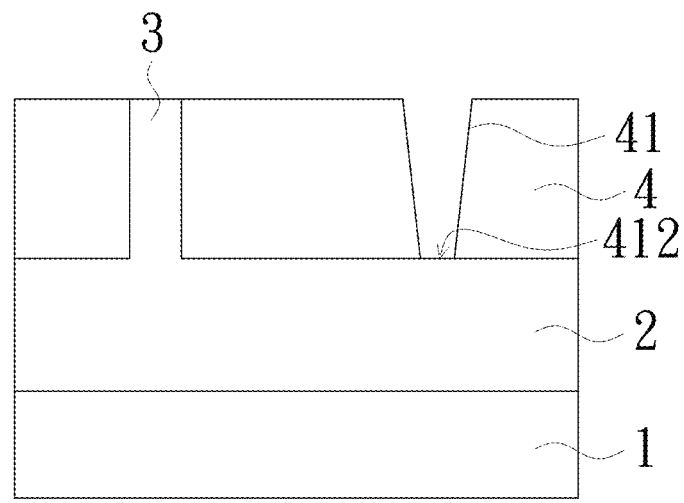
Figure 1E:
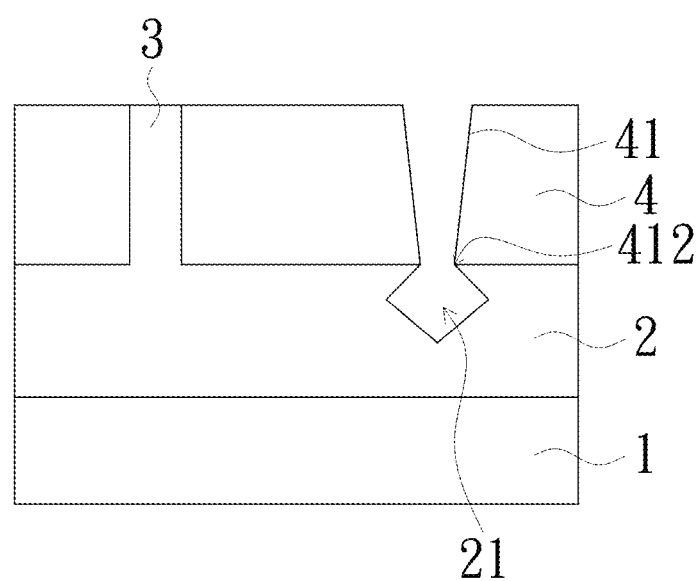
Figure 1F:
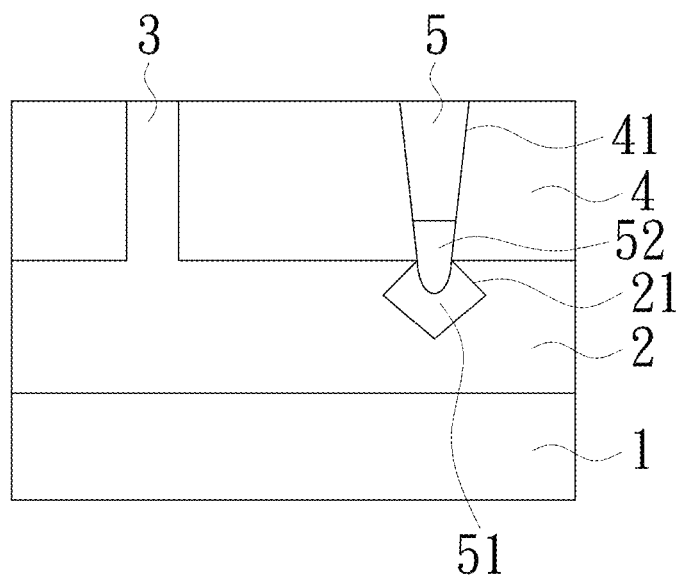
Figure 1G:
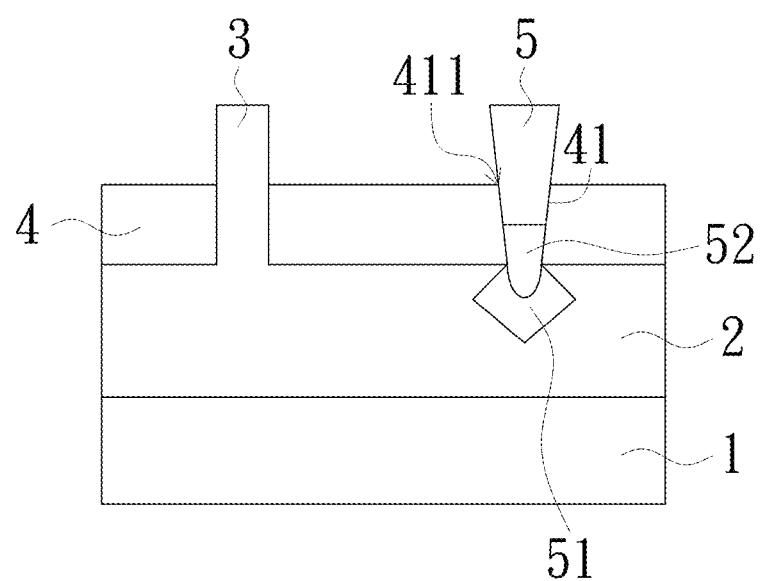
Figure 1H:
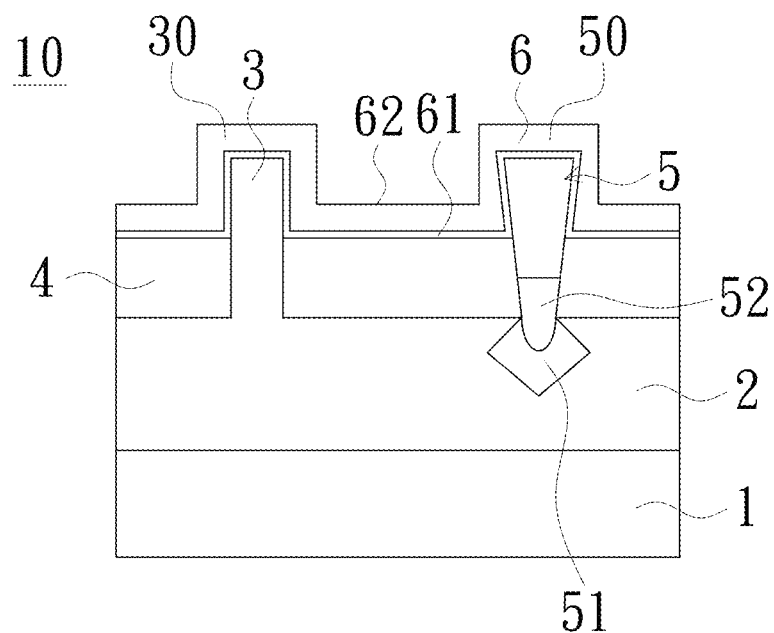
Figure 2A:
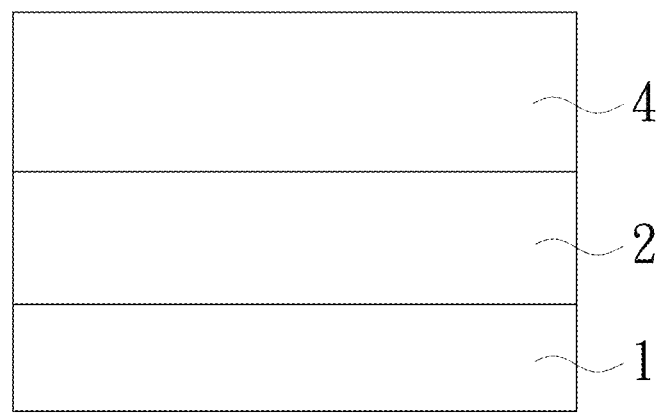
FIGS. 2A-2E are schematic diagrams of manufacturing steps of a heterogeneously integrated semiconductor device according to another embodiment of the present invention.
Figure 2B:
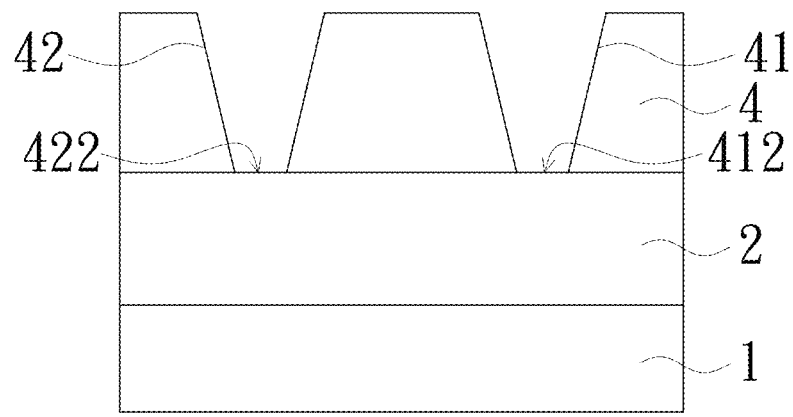
Figure 2C:
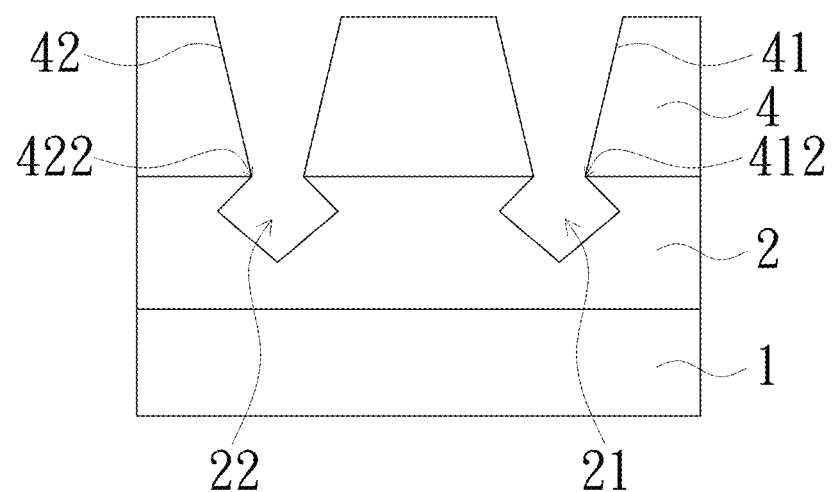
Figure 2D:
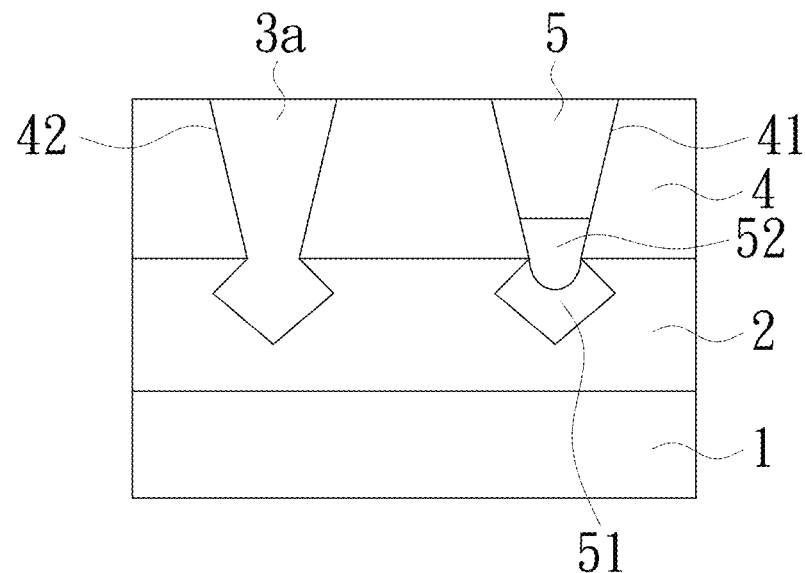
Figure 2E:
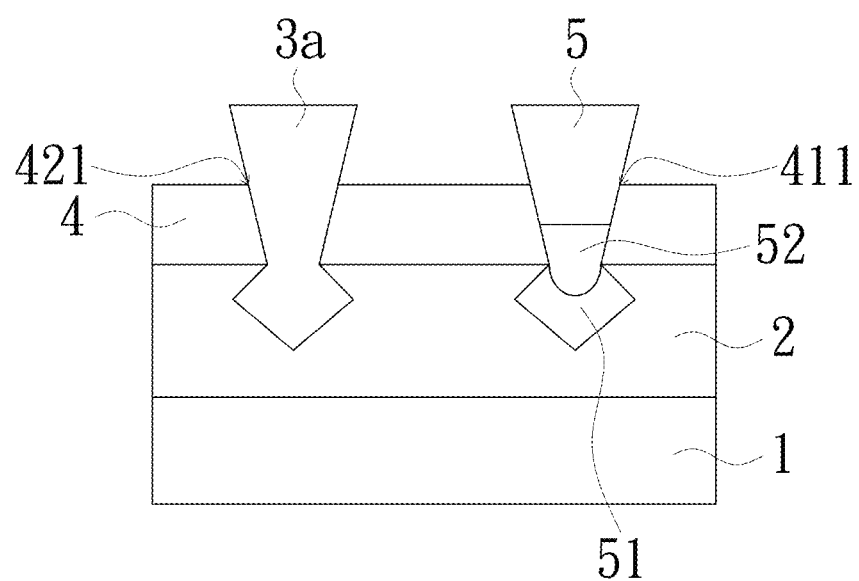
Figure 2E:
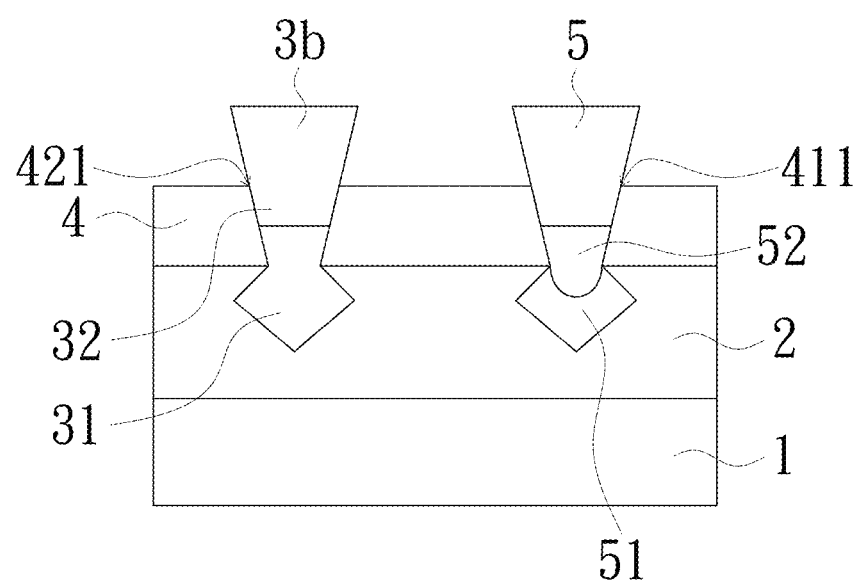
Figure 26:
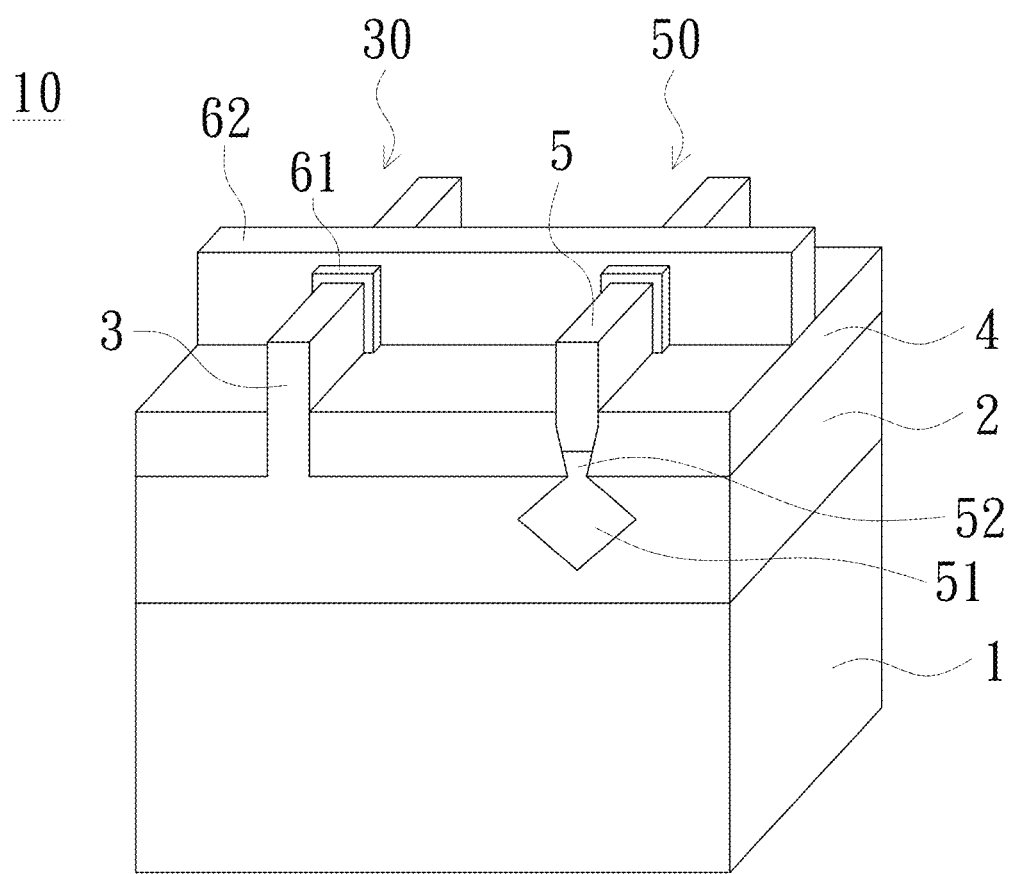
FIG. 26 illustrates another semiconductor device.

FIG. 1H and FIG. 26 illustrates a heterogeneously integrated semiconductor device 10 according to the present invention, which includes the base substrate 1; the Ge-containing film 2 formed on the surface of the base substrate 1; the PMOSFET transistor 30 and NMOSFET transistor 50 formed on the surface of the Ge-containing film 2, wherein the PMOSFET transistor 30 and the NMOSFET transistor 50 form a CMOS transistor. The PMOSFET transistor 30 includes a first fin 3, the NMOSFET transistor 50 includes a second fin 5. The first fin 3 and the second fin 5 are functioned as the source/drain area respectively and functioned as the channel layers of the PMOSFET transistor 30 and the NMOSFET transistor 50 respectively. The insulating layer 4 is formed above the Ge-containing film 2 and between the first fin 3 and the second fin 5, wherein the second fin 5 is formed within the first trench 41 (referring to FIG. 1D) of the insulating layer 4. A portion of the surface areas of the first fin 3 and the second fin 5 are covered by the gate structure 6, and the areas of the first fin 3 and the second fin 5 covered by the gate structure 6 form the channel layers of the PMOSFET transistor 30 and the NMOSFET transistor 50, respectively. The base substrate 1 is a Si substrate in this embodiment. In other embodiments, the substrate 1 may comprises Si or Ge. It is noticeable that, the first fin 3 comprises Ge-containing material, while the second fin 5 comprises Group III-V compound, and thus the PMOSFET transistor 30 and the NMOSFET transistor 50 are heterogeneously integrated on the base substrate 1 side by side. In the embodiment shown in FIG. 1H, the Ge-containing material of the first fin 3 is identical to the material of the Ge-containing film 2, and the Ge-containing film 2 and the first fin 3 comprise Ge, $Si_{1-x}Ge_x$ or $Ge_{1-b}Sn_b$. Therefore, the Ge-containing film 2 and the first fin 3 are formed in an integrated structure, and the first fin 3 may be formed by processes such as etching, etc. In another embodiment of the present invention as shown in FIG. 2E, the Ge-containing material of the first fin 3a comprises a material different from the material of the Ge-containing film 2. The Ge-containing film 2 may comprise a first SiGe alloy ($Si_{1-x}Ge_x$) or a GeSn alloy ($Ge_{1-b}Sn_b$), and the first fin 3 is a second SiGe alloy ($Si_{1-t}Ge_t$), a second GeSn alloy ($Ge_{1-c}Sn_c$), or the combination thereof, both are formed by selective epitaxial growths. The insulating layer 4 may comprise silicon oxide or other materials suitable for forming the insulating layer.

Please refer to FIG. 1H and FIG. 2E. The Group III-V compound of the second fin 5 may comprise $In_zGa_{1-z}As$. The second fin 5 may further includes a diffusion barrier layer 51 disposed below the trench 41 and in the recess 22 (referring to FIG. 1E), and a buffer layer 52 disposed between the Group III-V compound of the second fin 5 and the Ge-containing film 2. The buffer 52 is for alleviating the lattice mismatch between the aforementioned channel layer and the diffusion barrier layer 51. Wherein, the band gap of the buffer layer 52 is greater than the energy gap of the aforementioned channel layer. The buffer layer 52 may comprise InP or $In_yGa_{1-y}P$, the InP described herein means a material comprising InP doped with one or multiple Group III-V elements such as Ga, Al, As, etc. By comprising the buffer layer 52, it is possible to find a material comprising $In_yGa_{1-y}P$ that is lattice-matched to $Si_{1-x}Ge_x$. Therefore, the defects on the III-V/SiGe interface may be reduced. For example, $In_{0.47}Ga_{0.53}P$ may be grown on and is lattice matched with a $Si_{0.05}Ge_{0.95}$ film.

As described above, the semiconductor device of the present embodiment comprising a base substrate 1 with a Ge-containing film 2 formed thereon, and comprising the Group III-V semiconductor having the highest electron mobility and the Ge-containing material with the highest hole mobility (e.g., Ge, SiGe or GeSn) on the inexpensive base substrate 1 is a great advantage of the present invention. Such heterogeneous integration, however, also has to face the drawbacks of heteroepitaxy and the cross doping that occurs between Group III-V and Group VI materials. Therefore, the above problem can be solved by using an aspect ratio trapping (ART) structure, and forming a diffusion barrier layer 51 between the buffer layer 52 and the Ge-containing film 2. The diffusion barrier layer 51 may comprise, for example, $GaAs_{1-a}Sb_a$ or $Ga_dAl_{1-d}As$, and formed within the recess 21 on the surface of the Ge-containing film 2 (referring to FIG. 1E). As shown in FIG. 1G, the first trench 41 formed within the insulating layer 4 includes a top opening 411 on the top surface of the insulating layer 4; and a bottom opening 412 disposed on the bottom surface of the insulating layer 4 and connectedly adjacent to the Ge-containing film 2, wherein the top opening 411 is greater than the bottom opening 412, and the inner diameter of the first trench 41 gradually decreases from the top opening 411 to the bottom opening 412. In other embodiments, the inner diameter of the first trench 41 may also gradually increases or keeps constant from the first opening to the bottom opening. The recess 21 is formed within the Ge-containing film 2 and connectedly adjacent to the bottom opening 412. The width of the recess 21 gradually increases from the bottom opening 412 and then gradually reduces, so that the cross section of the recess 21 presents a substantially rhombus shape. Through the above-mentioned design of the shape of the recess 21 and the shape of the first trench 41, more than 90% of defects due to heteroepitaxy can be confined to the bottom of the shallow trench isolation (STI) layer (the first fin 5, including the diffusion barrier layer 51 and the buffer layer 52), so that the defects of the active layer at the top of the second fin 5 can be reduced. Therefore, close to zero defect crystal quality. The shape of the first trench 41, except for the above-mentioned example that the lower width is narrower than the upper width, it may also be that the lower width is wider than the upper width, or may have another different shape.

An embodiment of a manufacturing process of the heterogeneously integrated semiconductor device 10 is illustrated in FIG. 1A to FIG. 1H. Referring to FIG. 1A, first of all, the Ge-containing layer 20 is formed on the base substrate 1 by epitaxial growth. Then, as shown in FIG. 1B, the Ge-containing layer 20 is etched to form the Ge-containing film 2 and the first fin 3. FIG. 1C illustrates that the insulating layer 4 is formed on the Ge-containing film 2 by epitaxial growth. Next, as shown in FIG. 1D, the insulating layer 4 is etched to form the first trench 41. After the first trench 41 is formed, as shown in FIG. 1E, a dry etching process and a succeeding wet etching process are performed to the Ge-containing film 2 below the first trench 41, and the recess 21 will be formed because of the different etching rates of different crystal surfaces during the wet etching process. Referring to FIG. 1F, the buffer layer 51 is epitaxially grown in the recess 21 and the buffer layer 52 is epitaxially grown in the first trench 41. The selective epitaxial growth (SEG) is then used to form the second layer 5 comprising Group III-V compound so that the buffer layer 52 is located between the diffusion barrier layer 51 and the second fin 5. The material of the buffer layer 52 is preferably lattice matched to the Group III-V compound of the second fin 5 to lower the interface defects between the Group III-V compound and Ge-containing film 2. The following-up process further includes, as shown in FIG. 1G, etching the insulating layer 4 to lower the surface and expose portions of the first fin 3 and the second fin 4, and as shown in FIG. 1H, the gate structure 6 is formed on the first fin 3 and the second fin 4, wherein the gate structure 6 includes a gate oxide layer 61 and a gate metal layer 62. Thus, a CMOS transistor comprising the PMOSFET transistor 30 and the NMOSFET transistor 50 is obtained. Since the PMOSFET transistor 30 and the NMOSFET transistor 50 have almost the same height, and with the side-by-side configuration, the present invention is more compatible with the high density principles and reaches the requirements of the integrated circuit compared to other integrations by silicon on insulator (SOI) or wafer bonding.

The first fin 3 may be formed by selective epitaxial growth in addition to lithography etching. Another embodiment of the manufacturing process of the heterogeneously integrated semiconductor device 10 is illustrated in FIG. 2A to FIG. 2E. First of all, as shown in FIG. 2A, the Ge-containing film 2 is formed on the surface of the base substrate 1, and the insulating layer 4 is formed on the Ge-containing film 2. Then, as shown in FIG. 2B, the first trench 41 and the second trench 42 are formed in the insulating layer 4. Wherein, the inner diameter of the first trench 41 and the inner diameter of the second trench 42 gradually increase at a direction from the exposed upper surface of the Ge-containing film 2 toward an upper surface of the insulating layer 4 distal from the Ge-containing film 2. The insulating layer 4 comprises bottom openings 412/422 exposing the upper surface of the Ge-containing film 2. After forming the first trench 41/the second trench 42, as shown in FIG. 2C, the recesses 21/22 are formed through the surface of the Ge-containing film 2. Next, as shown in FIG. 2D, the second fin 5/the first fin 3a are formed in the first trench 41/the second trench 42 by selective epitaxial growth, respectively. As shown in FIG. 2E, the top openings 411/421 are formed above the first trench 41/the second trench 42 after portions of the first fin 3a and the second fin 5 are exposed by etching the insulating layer 4. Since the inner diameters of the first trench 41/the second trench 42 gradually increase from the bottom openings 412/422 toward the upper direction, the sizes of the first openings 411/421 are larger than those of the bottom openings 412/422. And then a gate structure (not shown) is formed on the first fin 3a and the second fin 5, and the structure of a CMOS transistor is completely formed.

As mentioned previously, the first fin may comprise a second SiGe alloy ($Si_{1-t}Ge_t$), a second GeSn alloy ($Ge_{1-c}Sn_c$), or a combination of the two. For example, the first fin 3a shown in FIG. 2E may comprise a second SiGe alloy ($Si_{1-t}Ge_t$), and the Ge-containing film 2 may comprise a first SiGe alloy ($Si_{1-x}Ge_x$). Wherein, the value of t may be a constant, and $x \leq t \leq 1$ and $0 \leq x \leq 1$. In another embodiment, the concentration of the material of the first fin 3a may be graded, and the value of t may be changed from t=x to t=t' in the first fin 3a, where x t'≤1. In another embodiment, as shown in FIG. 2E', the lower half portion 31 of the first fin 3a comprises the second SiGe alloy ($Si_{1-t}Ge_t$) and the upper half portion 32 of the second GeSn alloy ($Ge_{1-c}Sn_c$). Here, the variation of the numerical distribution range of t and x is similar to that of the first fin 3a, and the value of c may be a constant, and $0 \leq c \leq 0.2$.

Figure 3:
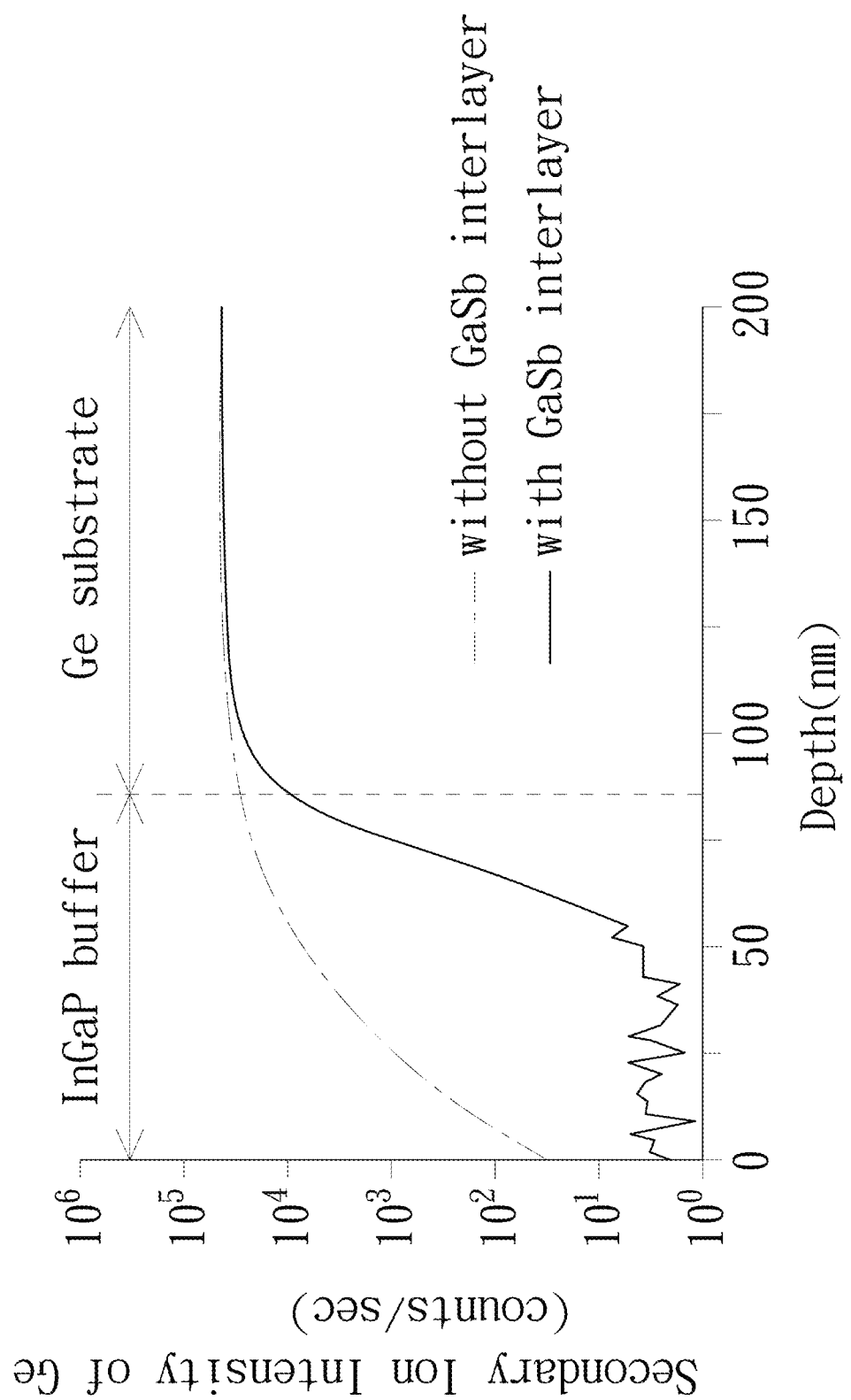
FIG. 3 is an experimental data plot of the effect of the GaSb interlayer on the distribution of the secondary ion intensity of Ge within the semiconductor depth between the Ge substrate and the InGaP buffer layer.

The diffusion barrier layer 51 may effectively improve the cross-doping problem between Group III-V and VI materials at heterogeneous integration. The experimental data in FIG. 3 illustrates that when the GaSb interlayer exists or does not exist between the Ge substrate and the InGaP (i-InGaP) buffer layer, and from the variations of the curves of the secondary ion intensity and the depth of the semiconductor, it can be seen that the Ge ion may be effectively blocked by the GaSb interlayer.

Figure 4:
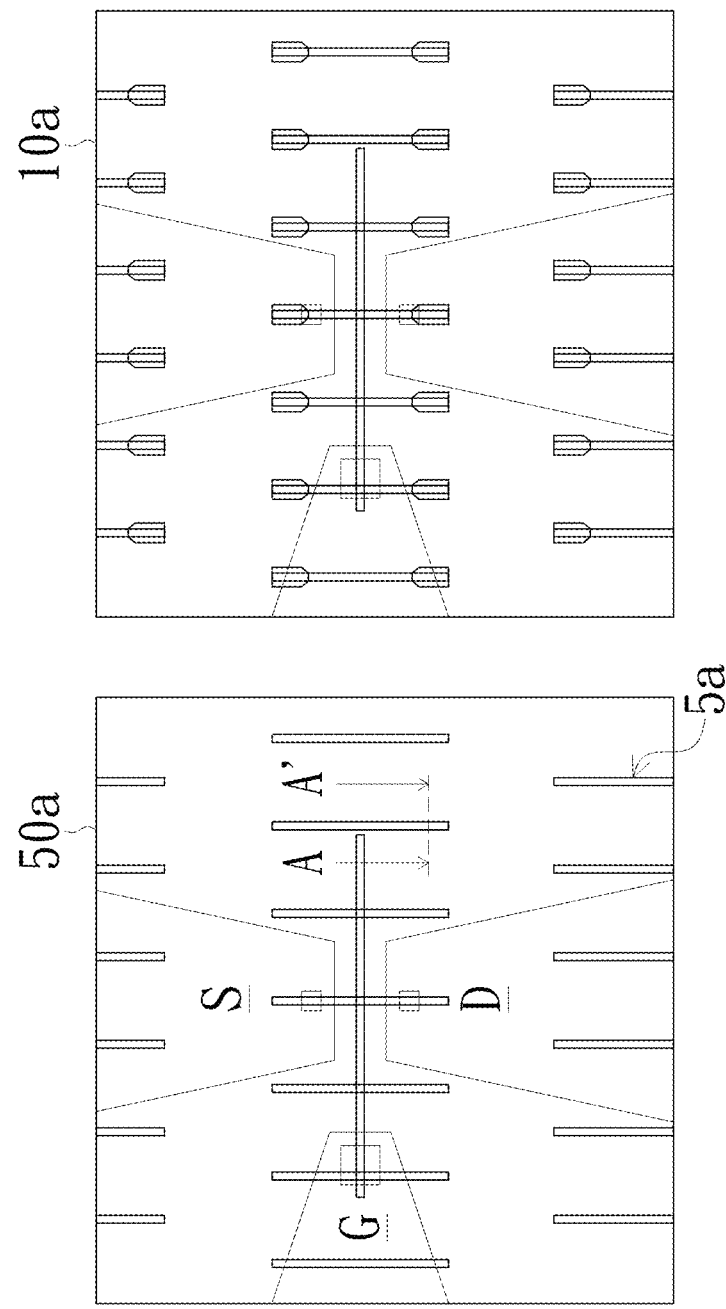
FIG. 4 is a top view of the semiconductor device. The semiconductor device may be an n-MOS.
Figure 5A:
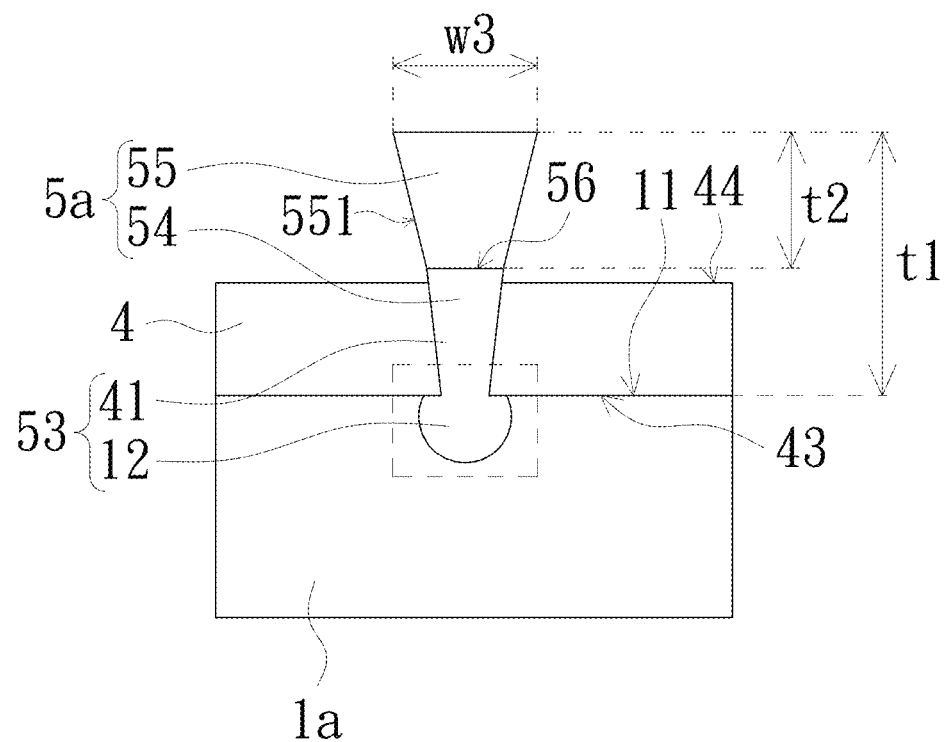
FIG. 5A is a top view of the semiconductor device. The semiconductor device may be an NMOSFET.
Figure 5B:
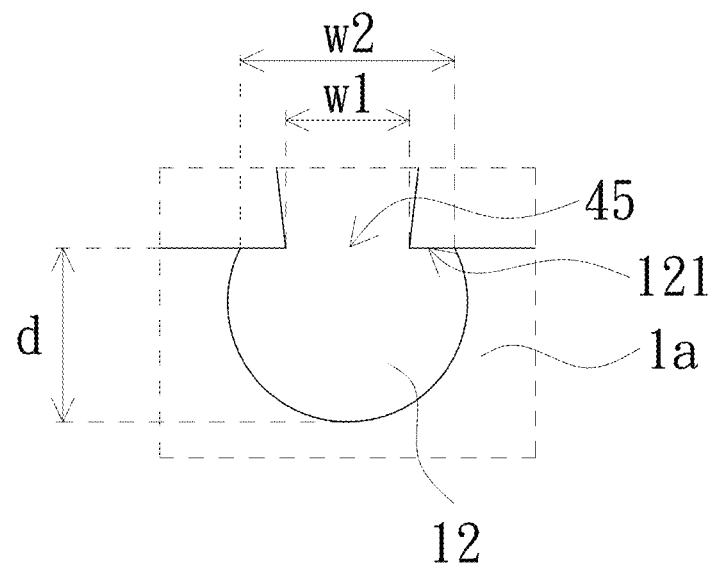
FIG. 5B is an enlarged detail in the dotted line in FIG. 5A.

FIG. 4 is a top view of a semiconductor device 10a according to an embodiment of the present invention. The semiconductor device 10a may comprise an n-MOSFET 50a having a source region S, a drain region D, a gate region G and fins 5a. FIG. 5A is a cross-sectional view along the A-A' line in FIG. 4. FIG. 5B is an enlarged detail in the dotted line in FIG. 5A. The semiconductor device 10a comprises a substrate 1a comprising an upper surface 11, an insulating layer 4 on the substrate 1a and comprising a lower surface 43 adjacent to the upper surface 11; and a groove 53 comprising a trench 41 penetrating the insulating layer 4 and extending into the substrate 1a such that the lower surface 43 of the insulating layer 4 has a first opening 45, and the upper surface 11 of the substrate 1a has a second opening 121, wherein the groove 53 further comprises a recess 12 in the substrate 1a and communicates with the trench 41. The substrate 1a comprises Si or Ge. The recess 12 exposes a crystal face of the substrate. The semiconductor device 10a further comprises a fin 5a comprising a first semiconductor layer 54 in the recess 12, and the first semiconductor layer 54 has an electron mobility higher than that of the substrate 1a. The fin 5a further comprises a second semiconductor layer 55 in the trench 41 and on the first semiconductor layer 54, wherein the second semiconductor layer 55 has an electron mobility higher than that of the first semiconductor layer 54. Preferably, the second semiconductor layer 55 has an electron mobility higher than 8000 cm$^2$/Vs or a hole mobility greater than 1,500 cm$^2$/V-s.

Preferably, the first semiconductor layer 54 has an energy gap greater than that of the second semiconductor layer 55 to reduce leakage current. The first semiconductor layer 54 has an energy band gap greater than 1 eV.

The first opening 45 has a first width w1, the second opening 121 has a second width w2, and the second semiconductor layer 55 distal from the recess 12 has a third width w3. The second width w2 is greater than the first width w1. The ratio of the first width w1 to the second width w2 is between 1/2 and 1/5. The third width w3 is greater than the first width w1. The ratio of the first width w1 to the third width w3 is between 1/2 and 1/5. In one embodiment, the first width w1 is not more than 40 nm, and preferably not more than 25 nm. In one embodiment, the second width w2 is not more than 100 nm, and preferably not more than 70 nm. The third width w3 is not more than 100 nm, and preferably not more than 70 nm.

The fin 5a has a first thickness t1. The second semiconductor layer 55 has a second thickness t2. The recess 12 has a depth d. The depth d of the recess 12 is of not more than 40% of the first thickness t1, and preferably, not more than 30% of the first thickness t1. The second thickness t2 is not more than 40% of the first thickness t1, and preferably, not more than 30% of the first thickness t1. In one embodiment, the first thickness t1 is not more than 250 nm, and preferably not more than 220 nm. The depth d is of between 50 nm and 60 nm. In one embodiment, the upper surface 44 of the insulating layer 4 is below the interface 56 between the second semiconductor layer 55 and the first semiconductor layer 54 to entirely expose a sidewall 551 of the second semiconductor layer 55.

In one embodiment, the insulating layer 4 has a thickness less than a thickness of the first semiconductor layer 54.

The first semiconductor layer 54 comprises (Al$_x$Ga$_{1-x}$)$_y$In$_{1-y}$P, wherein 0≤x≤1, 0≤y≤1. The second semiconductor layer 55 comprises (Al$_x$Ga$_{1-x}$)$_y$In$_{1-y}$As, wherein 0≤x≤1, 0≤y≤1. The second semiconductor layer 55 has a dislocation density less than that of the first semiconductor layer 54. Specifically, the first semiconductor layer 54 in the trench 41 has a dislocation density less than that of the first semiconductor layer 54 in the recess 12. The difference between the dislocation density of the second semiconductor layer 55 and the dislocation density of the first semiconductor layer 54 is larger than an order, and preferably, larger than 2 orders. In one embodiment, the second semiconductor layer 55 has a dislocation density not more than 1×10$^7$/cm$^2$, and preferably, not more than 1×10$^6$/cm$^2$. The dislocation density of the first semiconductor layer 54 in the recess 12 is not more than 1×10$^9$/cm$^2$, and preferably, not more than 1×10$^8$/cm$^2$.

In one embodiment, the first semiconductor layer 54 is p-type to reduce leakage current. The dopant in the first semiconductor layer 54 comprises, but is not limited to, C, Zn and Mg. The doping concentration is more 1×10$^{16}$ cm$^3$, and preferably, less than 1×10$^{22}$ cm$^{-3}$. From a cross-sectional view, the shape of the recess 12 may be, but is not limited to, triangular and semicircular.

In one embodiment, the first semiconductor layer 54 comprises (Al$_x$Ga$_{1-x}$)$_y$In$_{1-y}$P, wherein 0=x, 0≤y≤0.45. The second semiconductor layer 55 comprises (Al$_x$Ga$_{1-x}$)$_y$In$_{1-y}$As, wherein 0=x, 0≤y≤0.8, and preferably, 0≤y≤0.4. In one embodiment, the amount of the Group III elements in the first semiconductor layer 54 may gradually change in a direction from the substrate 1a toward the insulating layer 4. Specifically, the amount of Indium in the first semiconductor layer 54 may gradually increase in a direction from the substrate 1a toward the insulating layer 4. In one embodiment, the amount of the Group III elements in the second semiconductor layer 55 may gradually change in a direction from the substrate 1a toward the insulating layer 4. Specifically, the amount of Indium in the second semiconductor layer 55 may gradually increase in a direction from the substrate 1a toward the insulating layer.

Figure 6A:
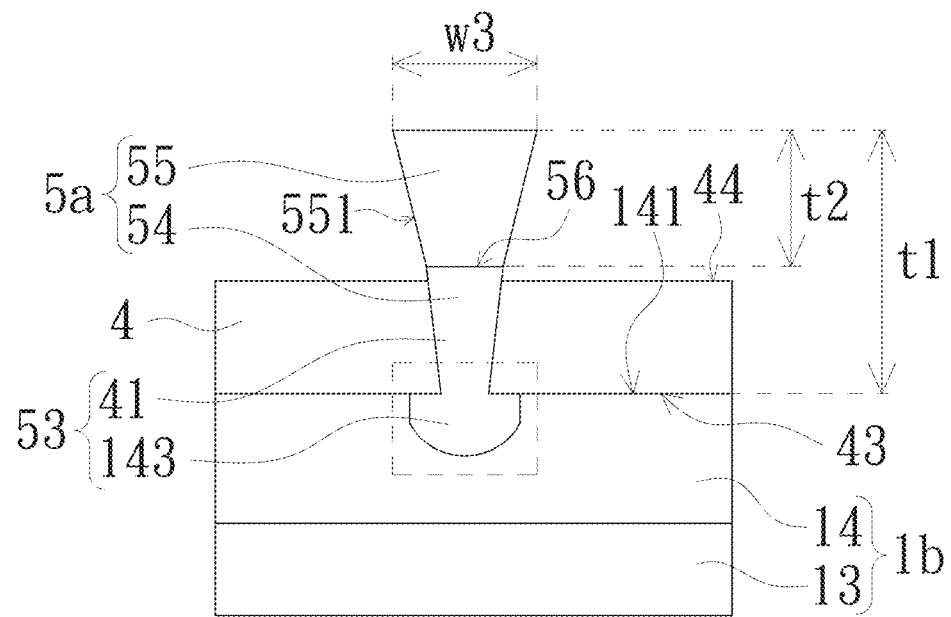
FIG. 6A is another cross-sectional view along the A-A' line in FIG. 4.
Figure 6B:
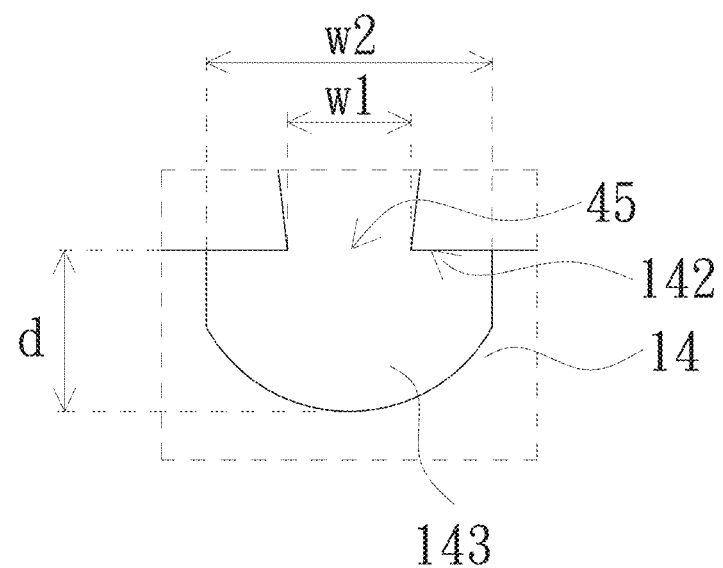
FIG. 6B is an enlarged detail in the dotted line in FIG. 6A.

FIG. 6A is another cross-sectional view along the A-A' line in FIG. 4 according to another embodiment of the present invention. FIG. 6B is an enlarged detail in the dotted line in FIG. 6A. In such an embodiment, the substrate 1b of the semiconductor device 10a comprises a base layer 13 and a buffer layer 14 on the base layer 13. The buffer layer 14 has an electron mobility higher than that of the base layer 13. The fin 5a penetrates the insulating layer 4 and extends into the buffer layer 14 such that the lower surface 43 of the insulating layer 4 has the first opening 45, and the upper surface 141 of the buffer layer 14 has a second opening 142. The recess 143 is in the buffer layer 14. In one embodiment, the buffer layer 14 comprises, but is not limited to, Ge.

Figure 7A:
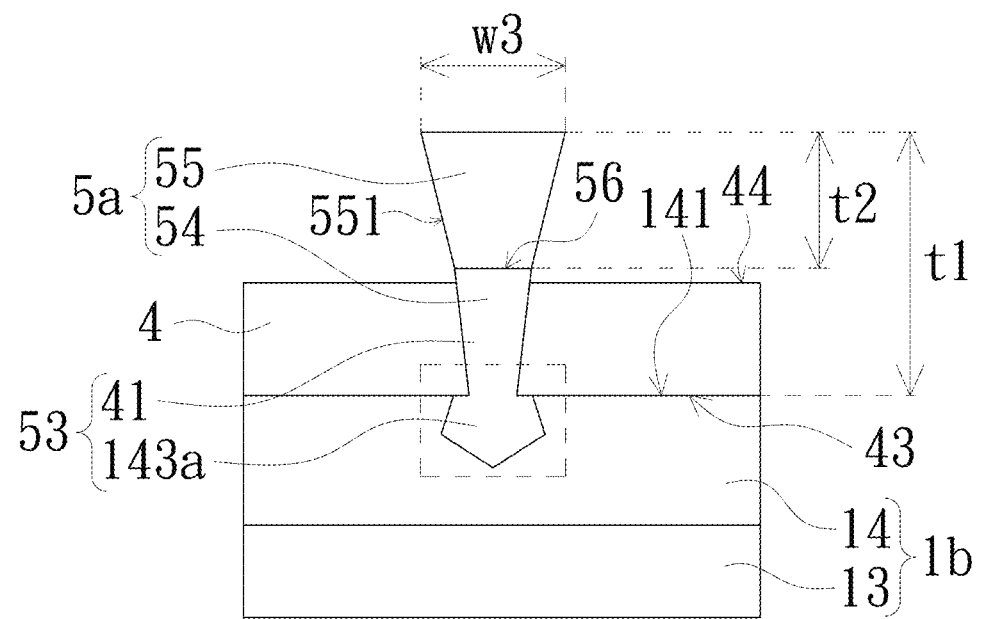
FIG. 7A is another cross-sectional view along the A-A' line in FIG. 4.
Figure 7B:
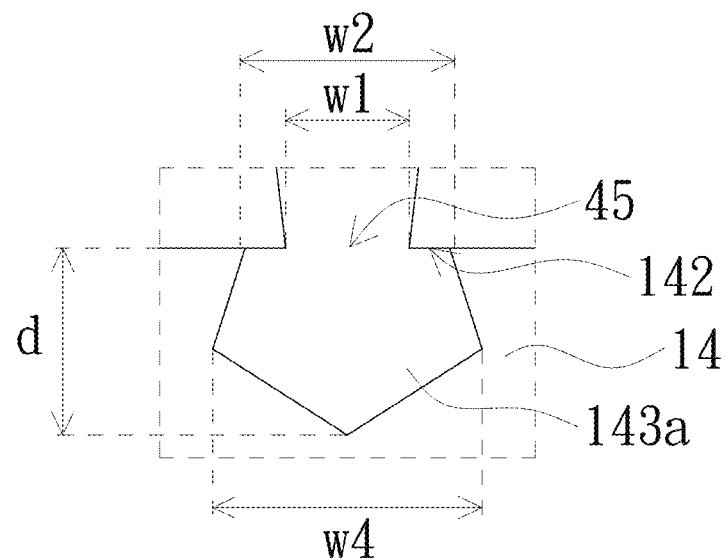
FIG. 7B is an enlarged detail in the dotted line in FIG. 7A.
Figure 8:
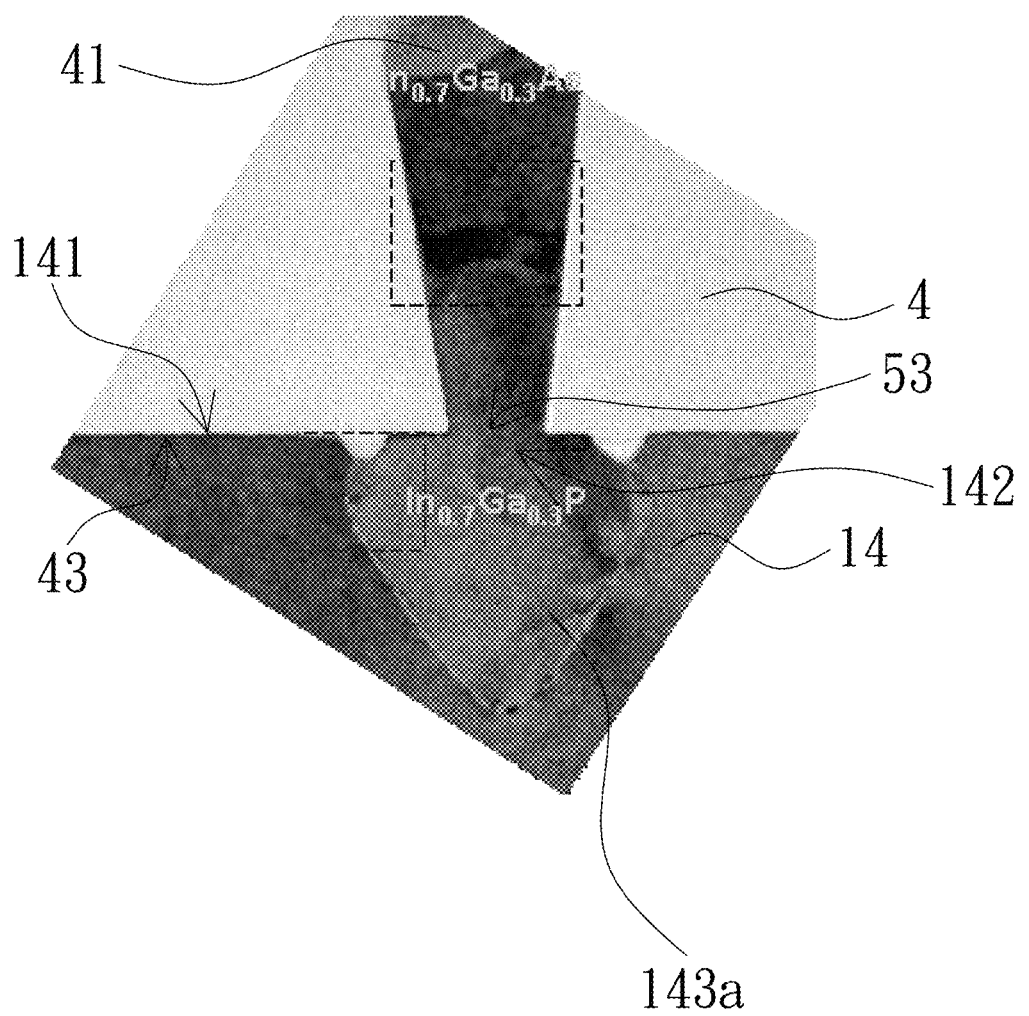
FIG. 8 is a TEM image of the cross sectional view along the A-A' line in FIG. 4.
Figure 9A:
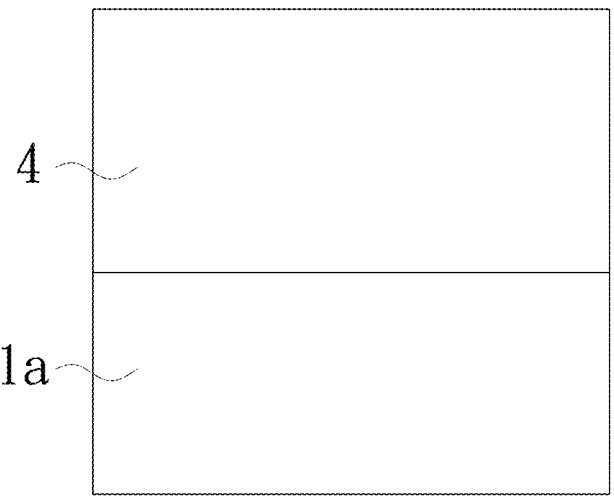
FIGS. 9A-9H demonstrate the method of making the fin of the semiconductor device.
Figure 9B:
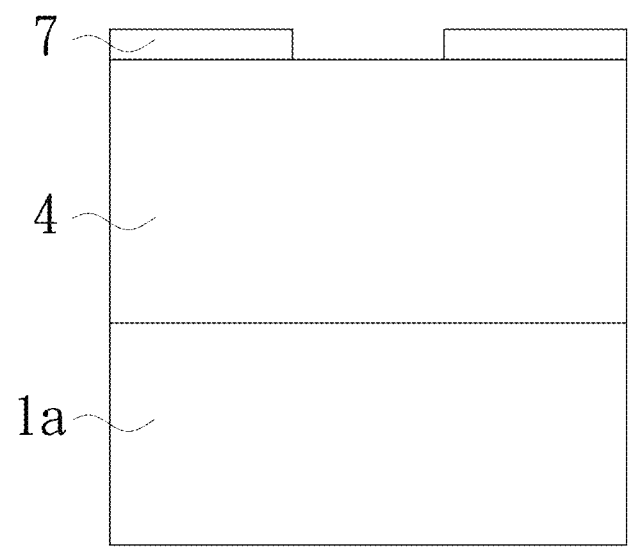
Figure 9C:
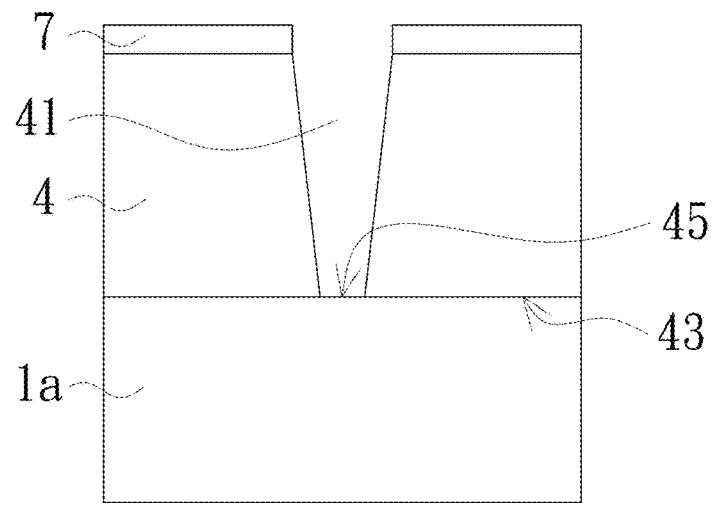
Figure 9D:
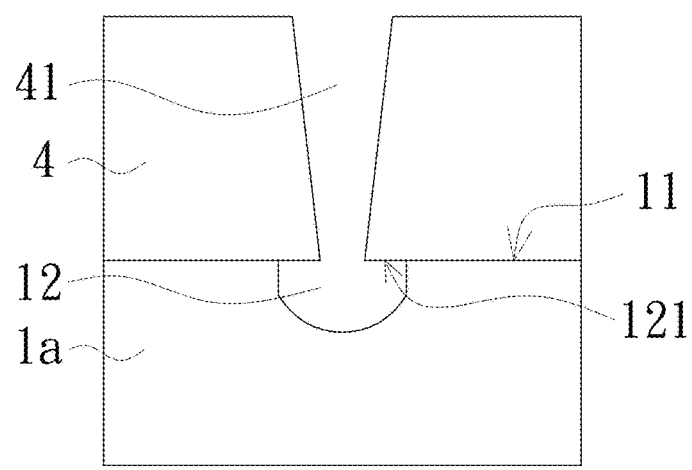
Figure 9E:
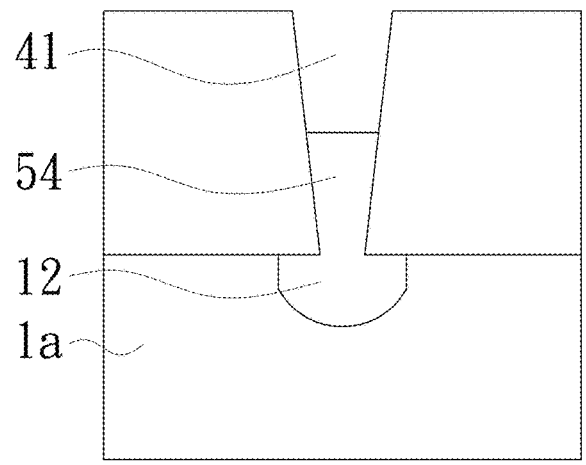
Figure 9F:
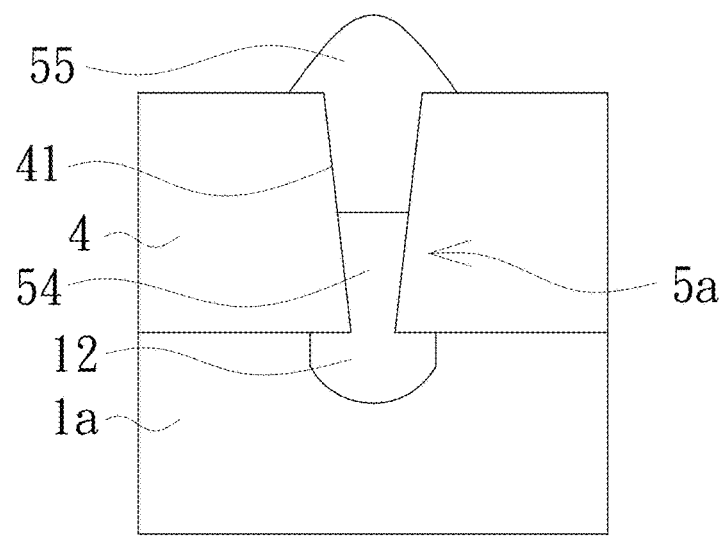
Figure 9G:
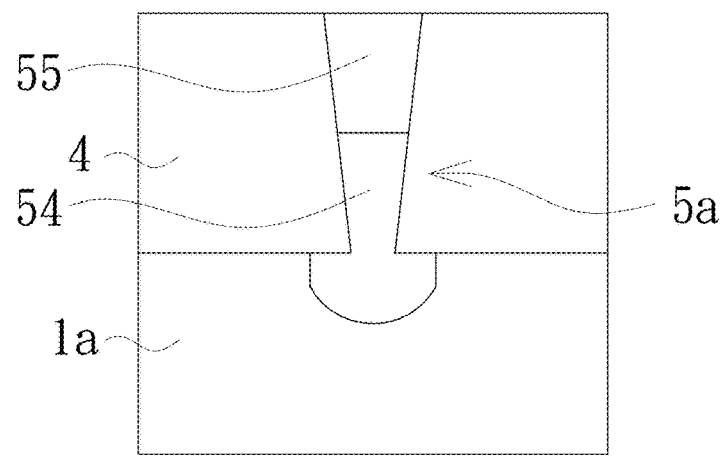
Figure 9H:
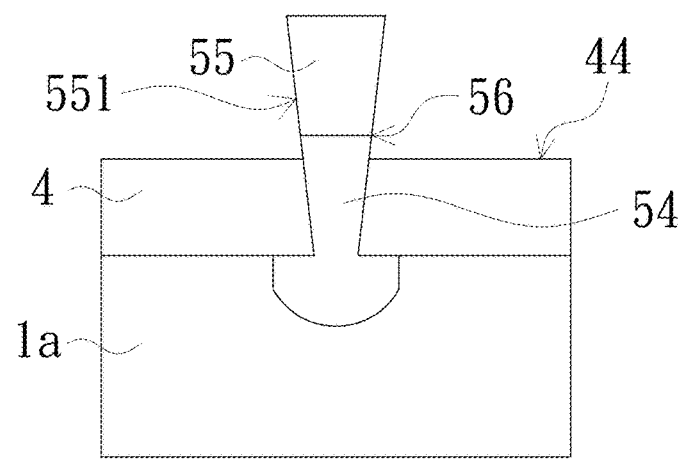

In one embodiment as shown in FIG. 7A, FIG. 7B and FIG. 8, the recess 143a has a fourth width w4 below the upper surface 141 of the substrate 1b. The fourth width w4 is greater than the first width w1. The ratio of the first width w1 to the fourth width w4 is between 1/2 and 1/6. From a cross-sectional view, the shape of the recess 143a may be pentagonal.

In the present disclosure, as shown in FIG. 8 with reference to FIG. 7A and FIG. 7B, because the groove 53 has the recess 143a formed in the substrate 1b and the second width w2 is greater than the first width w1, after epitaxially growing the first semiconductor layer 54 in the recess 143a and the trench 41, the dislocation of the first semiconductor layer 54 may be mostly trapped in the recess 143a and blocked by the insulating layer 4. Therefore, the part of the first semiconductor layer 54 having higher dislocation density is farther from the second semiconductor layer 55, whose quality will affect the performance of the semiconductor device 10a.

FIGS. 9A-9H demonstrate the method of making the fin 5a of the semiconductor device 10a. The method includes steps of: (A) providing a substrate 1a, forming an insulating layer 4 on the substrate 1a, wherein the method of forming the insulating layer 4 is not limited to deposition; (B) forming a mask 7 on the insulating layer 4 to expose a region; (C) etching the exposed region to form a trench 41 penetrating the insulating layer 4 and thus the lower surface 43 of the insulating layer 4 has a first opening 45, wherein the method of forming the trench 41 is, but not limited to, dry etching; (D) removing the mask 7 and forming a recess 12 penetrating though the upper surface 11 of the substrate 1a and extending into the substrate 1a such that the upper surface 11 of the substrate 1a has a second opening 121, wherein the method of forming the recess 12 is, but not limited to, wet etching, the wet etching rate and the etchant can be adjusted to determine the shape and the depth of the recess 12; in one embodiment, the etchant comprises a solute and a solvent at a ratio of between 1:10 and 1:90; in one embodiment, the etchant comprises a mixture of $H_2O_2$ and $H_2O$; in one embodiment, the etchant is composed of water; in one embodiment as shown in FIG. 7B, the recess 143a having the fourth width w4 can be formed by an etching rate slower than 200 nm/min, and preferably slower than 150 nm/min, and more preferably, slower than 100 nm/min, in one embodiment, as shown in FIG. 6A and FIG. 6B, the recess 143 is in the buffer layer 14, and the recess 143 exposes a (111) crystal face of the buffer layer 14; (E) forming a first semiconductor layer 54 in the recess 12 and in a part of the trench 41 by selective epitaxial growth; (F) forming a second semiconductor layer 55 in the trench 41 and on the first semiconductor layer 54 by epitaxial growth, during the growing process, a first precursor comprising a Group V element and a second precursor comprising a Group III element are introduced into the chamber (not shown), wherein a ratio of the Group V element to the Group III elements is greater than 800, and preferably between 900 and 1500; (G) removing the excess part of the second semiconductor layer 55 protruding from the upper surface of the insulating layer 4; (H) removing a portion of the insulating layer 4 to expose the sidewall 551 of the second semiconductor layer 55, preferably, the upper surface 44 of the of the insulating layer 4 is below the interface 56 between the second semiconductor layer 55 and the first semiconductor layer 54.

Figure 10:
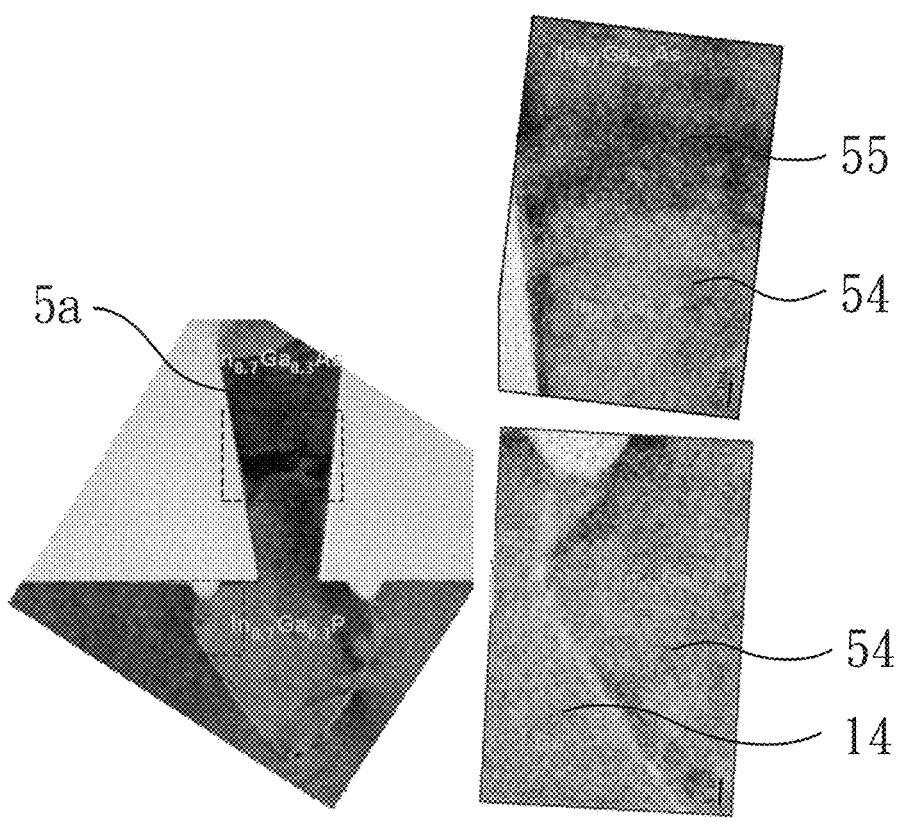
FIG. 10 shows TEM images of the fin, and of an enlarged detail of the first semiconductor layer and the second semiconductor layer.
Figure 11:
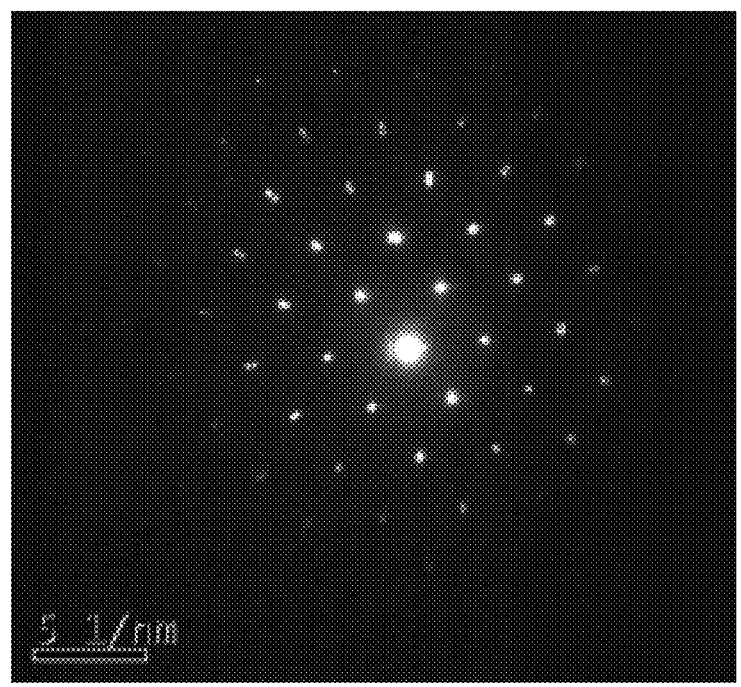
FIG. 11 shows an SAD image of the first semiconductor layer.

FIG. 10 shows a TEM image of the fin 5a, and enlarged details of the first semiconductor layer 54 and the second semiconductor layer 55. FIG. 11 shows an SAD image of the first semiconductor layer 54. From the result of SAD, the in-plane lattice constant of InGaAs layer is quite close to InGaP layer. That is, InGaAs is under compressive strain.

Figure 12:
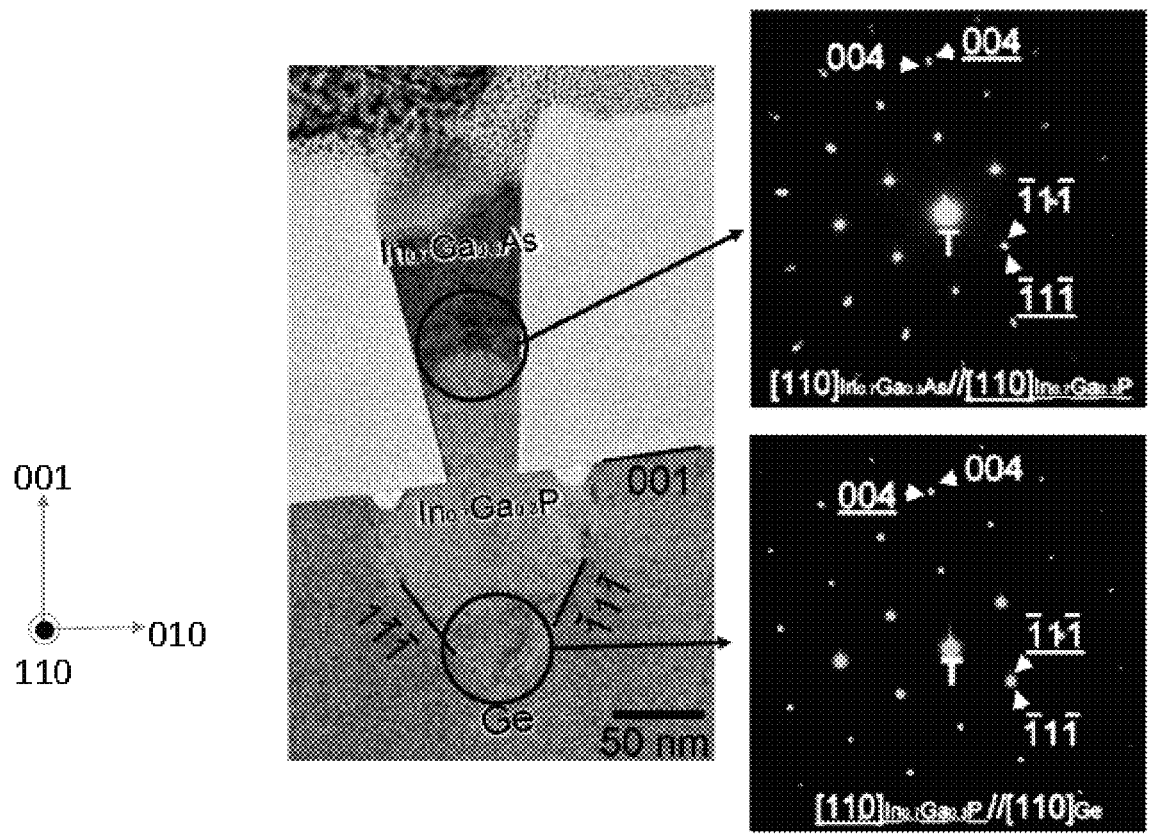
FIG. 12 shows SAD images of the first semiconductor layer and the second semiconductor layer to determine the crystal facets.
Figure 13:
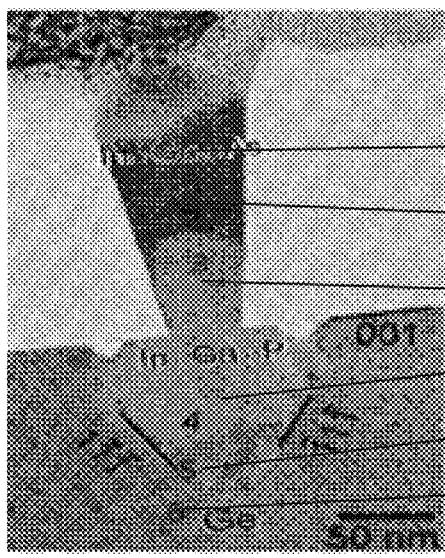
FIG. 13 shows the lattice constant along {002} and along {111} of the six parts in the buffer later, the first semiconductor layer and the second semiconductor layer.

FIG. 12 shows SAD images of the first semiconductor layer 54 and the second semiconductor layer 55 to determine the crystal facets. FIG. 13 shows the lattice constant along {002} and along {111} of the six parts in the buffer layer 14, the first semiconductor layer 54 and the second semiconductor layer 55 (also referring to FIGS. 7A to 7B). The difference between the lattice constant of the buffer layer 14 along {002} and that of the first semiconductor layer 54 is less than 2%, and may be more than 0.5%. The difference between the lattice constant of the first semiconductor layer 54 along {002} and that of the second semiconductor layer 55 is less than 5%, and may be more than 3%. The difference between the lattice constant of the buffer layer 14 along {111} and that of the first semiconductor layer 54 is less than 2%, and may be more than 1%. The difference between the lattice constant of the first semiconductor layer 54 along {002} and that of the second semiconductor layer 55 is less than 3%, and may be more than 1.5%. The second semiconductor layer 55 has a dislocation density less than that of the first semiconductor layer 54.

Figure 14:
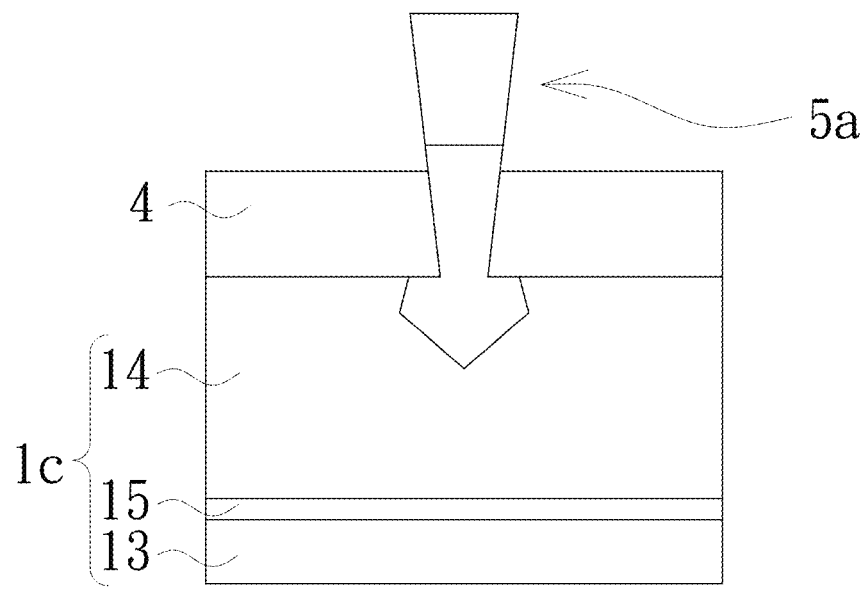
FIG. 14 is another cross-sectional view along the A-A' line in FIG. 4.

FIG. 14 is another cross-sectional view along the A-A' line in FIG. 4 according to still another embodiment. In such an embodiment, the substrate 1c comprises a first insulating layer 15 to further reduce leakage current. The first insulating layer 15 is between the buffer layer 14 and the base layer 13. The first insulating layer 15 comprises, but is not limited to, $SiO_2$.

Figure 15:
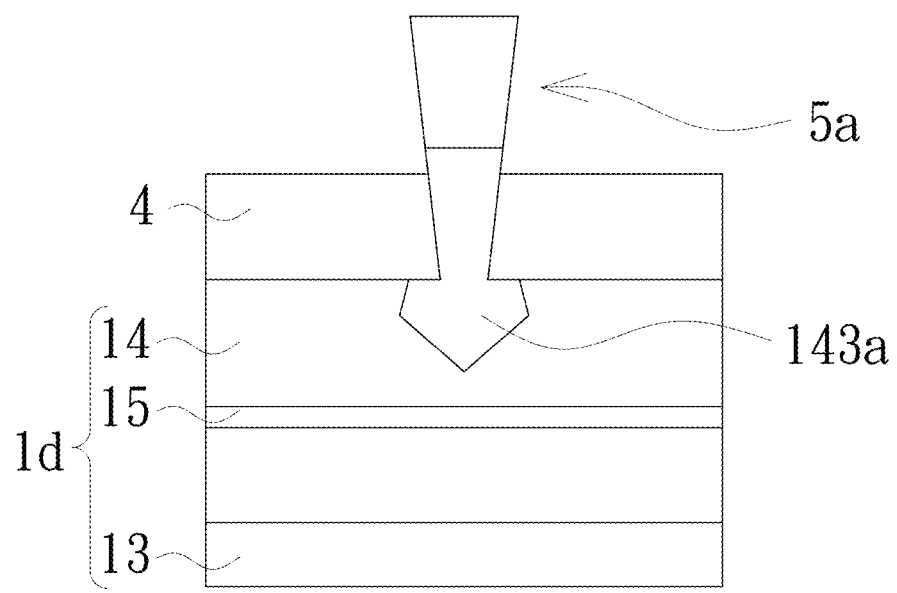
FIG. 15 is another cross-sectional view along the A-A' line in FIG. 4.

FIG. 15 is another cross-sectional view along the A-A' line in FIG. 4 according to yet another embodiment. In one embodiment, the first insulating layer 15 of the substrate 1d is in the buffer layer 14 and below the recess 143a. The first insulating layer 15 comprises one conductivity reducing layer formed by implantation. The conductivity reducing layer comprises oxygen or nitrogen.

Figure 16A:
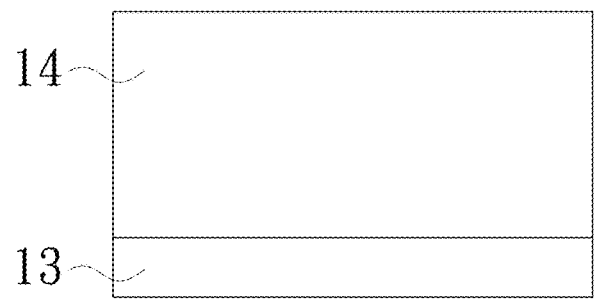
FIGS. 16A-16C demonstrate the method of making the structure shown in FIG. 15.
Figure 16B:
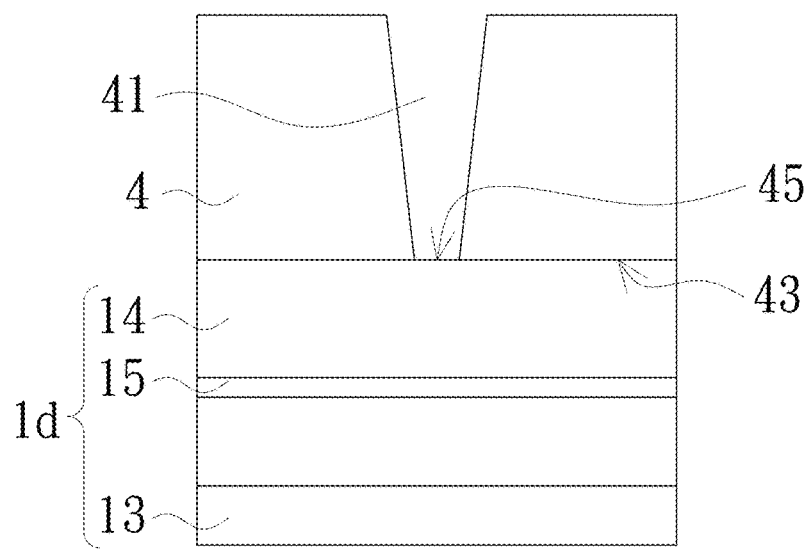
Figure 16C:
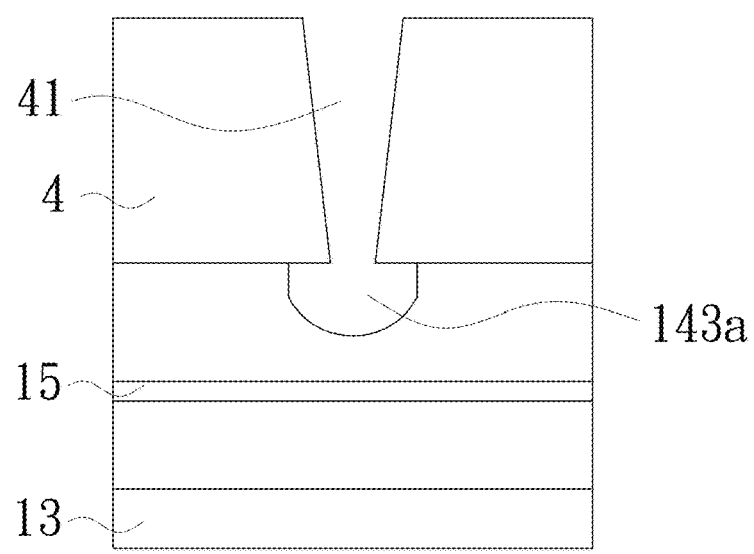

FIGS. 16A-16C demonstrate the method of making the structure shown in FIG. 15. The method comprises steps of: (A) implanting nitrogen and/or oxygen in to the buffer layer 14 to form a layer comprising the nitrogen and/or oxygen; (B) forming the insulating layer 4 on the substrate 1d, and forming a trench 41 penetrating the insulating layer 4 and thus the lower surface 43 of the insulating layer 4 having a first opening 45 is exposed, wherein the method of forming the trench 41 is, but not limited to, dry etching; (C) thermal annealing the structure to make the elements form a conductivity reducing layer with the layer of the buffer layer 14, in one embodiment, the conductivity reducing layer comprises germanium oxide, germanium nitride or germanium oxynitride, and forming a recess 143a as mentioned before. The following steps are substantially the same as aforementioned.

Figure 17:
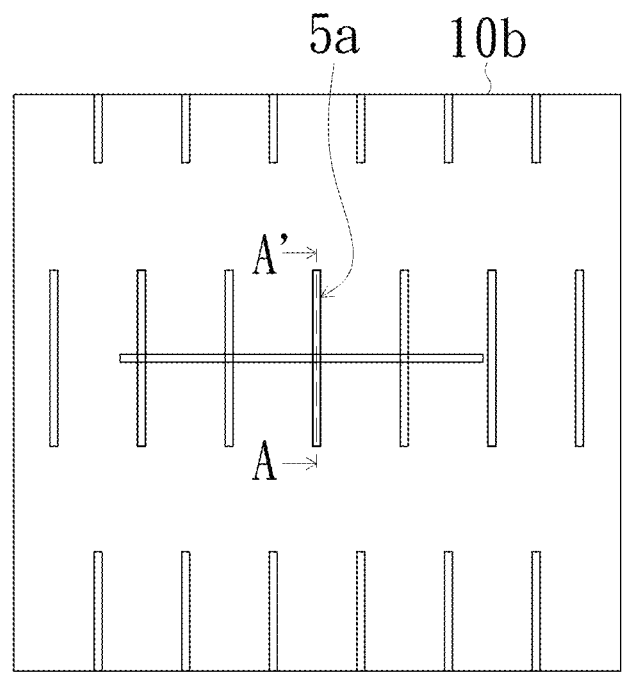
FIG. 17 shows a top view of the semiconductor device.
Figure 18:
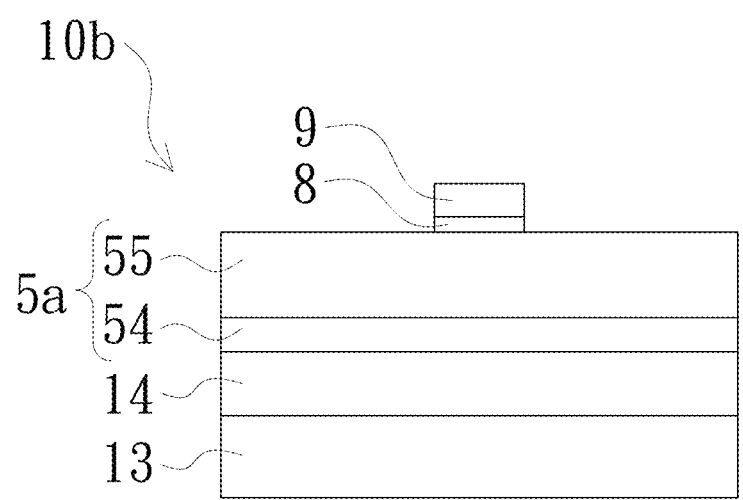
FIG. 18 is a cross-sectional view along the A-A' line in FIG. 17.

FIG. 17 shows a top view of the semiconductor device 10b. FIG. 18 is a cross-sectional view along the A-A' line in FIG. 17. The semiconductor device 10b further includes a dielectric layer 8 formed on the top of the fin 5a, and a gate layer 9 formed on the dielectric layer 8.

The method for fabricating the semiconductor device 10b may further comprise steps of: (a) cleaning the top surface of the second semiconductor layer 55 by an solution, preferably, by an acidic solution, for example, an acidic solution comprising HCl, and then treating the top surface of the second semiconductor layer to reduce surface defects by a solution comprises, but is not limited to, trimethyl aluminum (TMA); (b) depositing a dielectric precursor layer on the second semiconductor layer 55 and covering the exposed sidewall of the second semiconductor layer 55; (c) depositing a gate precursor layer on the dielectric precursor layer; (d) defining a gate area on the gate precursor layer and across the fin 5a by electron-beam lithography; (e) removing the part of the gate precursor layer other than the gate area and the dielectric precursor layer other than the gate area to form a gate layer 9 and a dielectric layer 8 between the gate layer 8 and the second semiconductor layer 55 by dry etching, and thus the gate layer 9 and the dielectric layer 8 have patterns identical to that of the gate area.

In one embodiment, the dielectric layer 8 comprises a layer having a dielectric constant higher than 8. Preferably, the dielectric layer 8 comprises, but is not limited to, $HFO_2$ or $Al_2O_3$. The thickness of the dielectric layer 8 is less than 15 nm, and preferably, less than 10 nm. In one embodiment, the gate layer 9 comprises, but is not limited to, TiN. The thickness of the gate layer 9 is less than 15 nm, and preferably, less than 10 nm.

Figure 19:
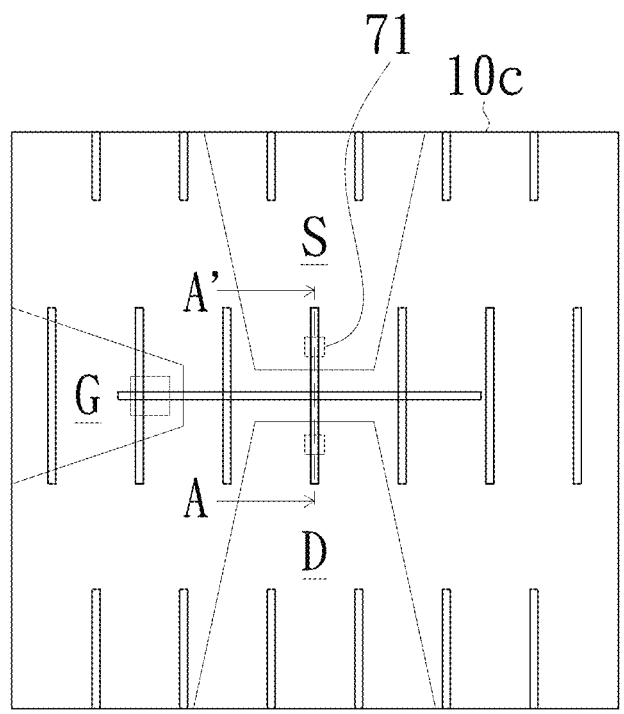
FIG. 19 is a top view of the semiconductor device.
Figure 20:
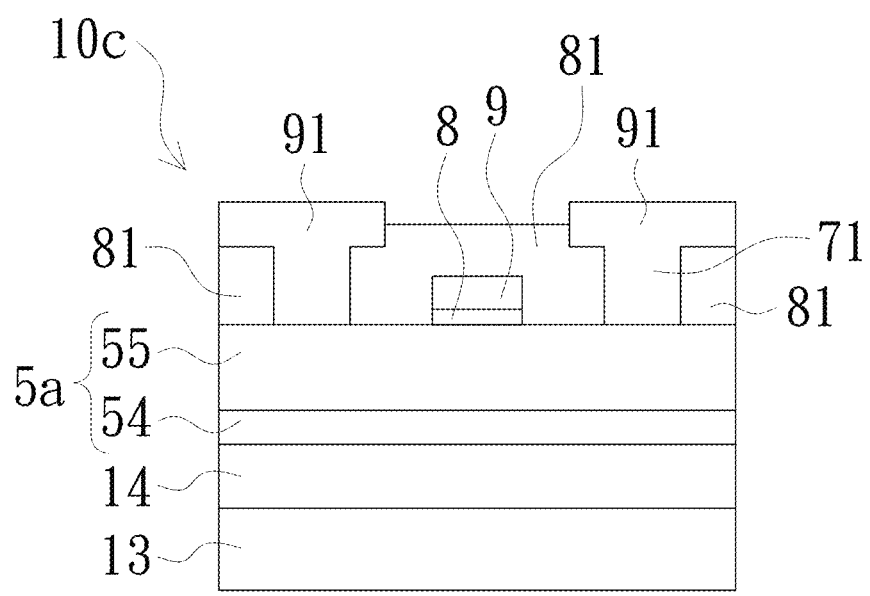
FIG. 20 is a cross-sectional view of the semiconductor device shown in FIG. 19.

FIG. 19 is a top view of the semiconductor device 10c. FIG. 20 is a cross-sectional view of the semiconductor device 10c shown in FIG. 19. The semiconductor device 10c may be an n-MOSFET. The semiconductor device 10c may further comprises a second insulating layer 81 formed on the top surface of the second semiconductor layer 55 and covering the gate layer 9 and the dielectric layer 8, and metal pads 91 penetrating through the second insulating layer 81 and contacting the second semiconductor layer 55 by the contact via holes 71, respectively.

The method for fabricating the semiconductor device 10c may further comprise steps of: (a) introducing a dopant in the second semiconductor layer 55 not covered by the gate layer 9 to define a source area S and a drain area D, wherein the dopant comprises Si, and the method of introducing the dopant comprises implantation; (b) activating the source area S and the drain area D by CO$_2$ laser or rapid thermal annealing; (c) depositing a second insulating layer 81 on the second semiconductor layer 55 and on the gate layer 9; (d) defining multiple contact areas on the second insulating layer 81 by electron-beam lithography; (e) removing the contact area of the second insulating layer 81 to form contact via holes 71 in the second insulating layer 81 and exposing the gate layer 9, the source area S and the drain area D by dry etching and/or wet etching; (f) depositing a metal layer on the second insulating layer 81 and filled in the contact via holes 71 to contact the gate layer 9, the source area S and the drain area D; (g) defining pad area on the metal layer by electron-beam lithography; (e) removing the part of the metal layer other than the contact via holes 71 to form metal pads 91 contacting the gate layer 9, the source area S and the drain area D by dry etching.

Figure 21:
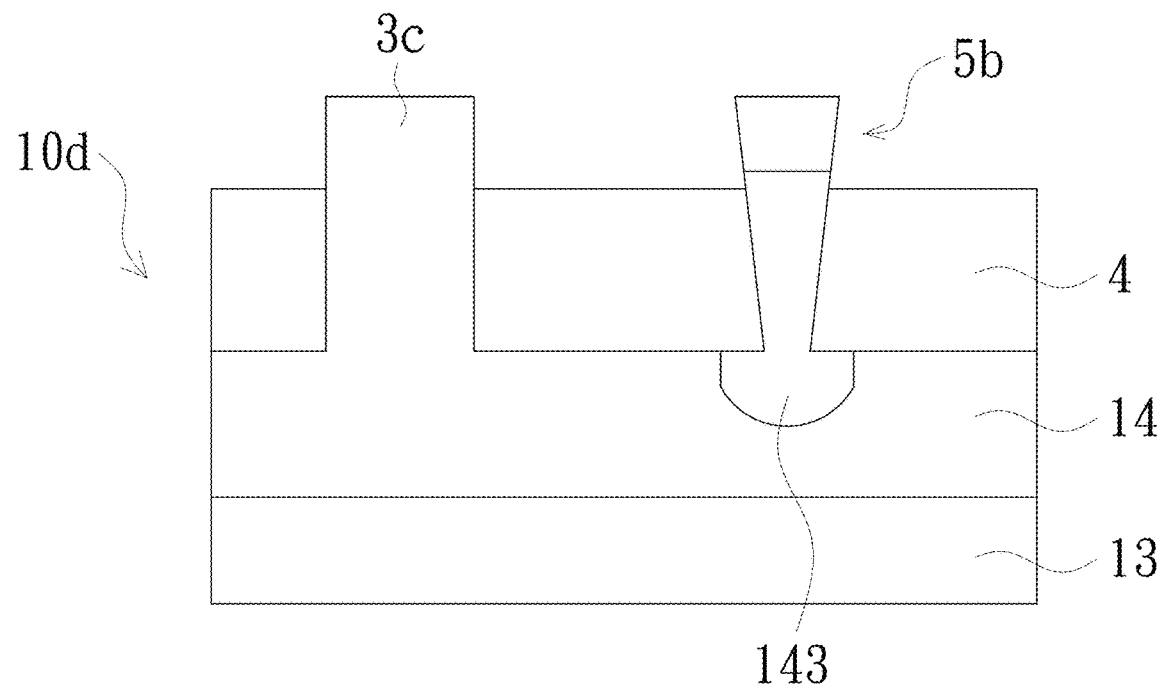
FIG. 21 is a cross-sectional view of another semiconductor device.

FIG. 21 is a cross-sectional view of another semiconductor device 10*d*. In one embodiment, the semiconductor device 10*d* comprises a first fin 3*c* and a second fin 5*b* on the same substrate 13. In one embodiment, the first fin 3*c* comprises the same material as that of the buffer layer 14.

Figure 22:
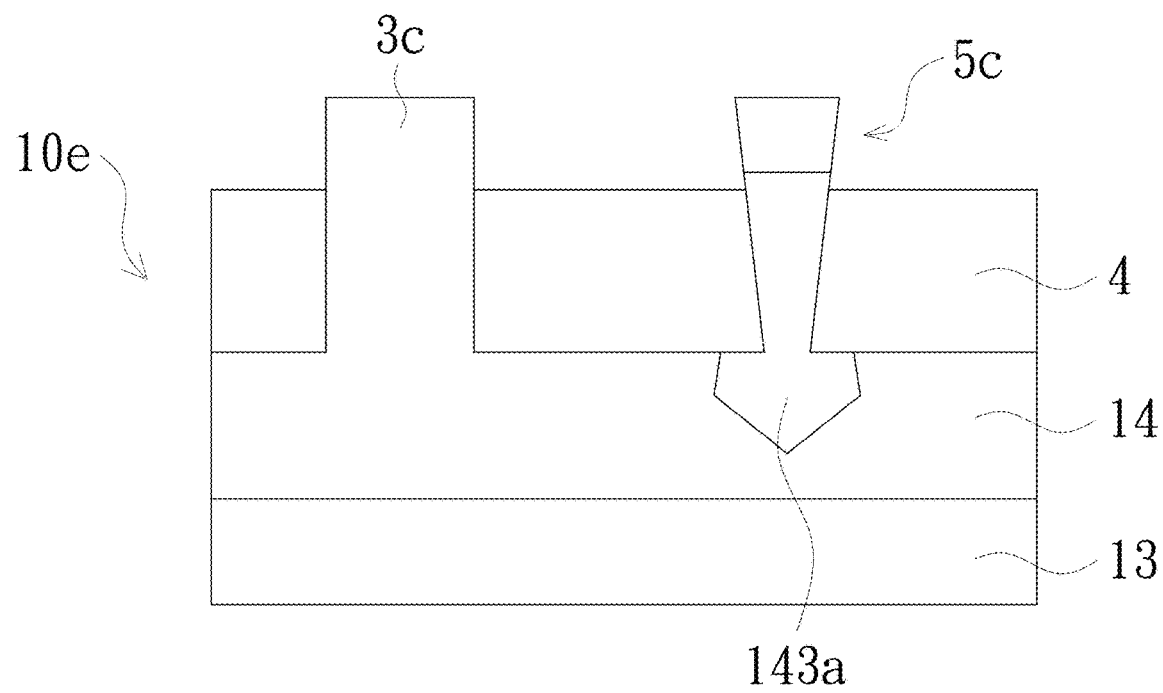
FIG. 22 is a cross-sectional view of another semiconductor device.
Figure 23A:
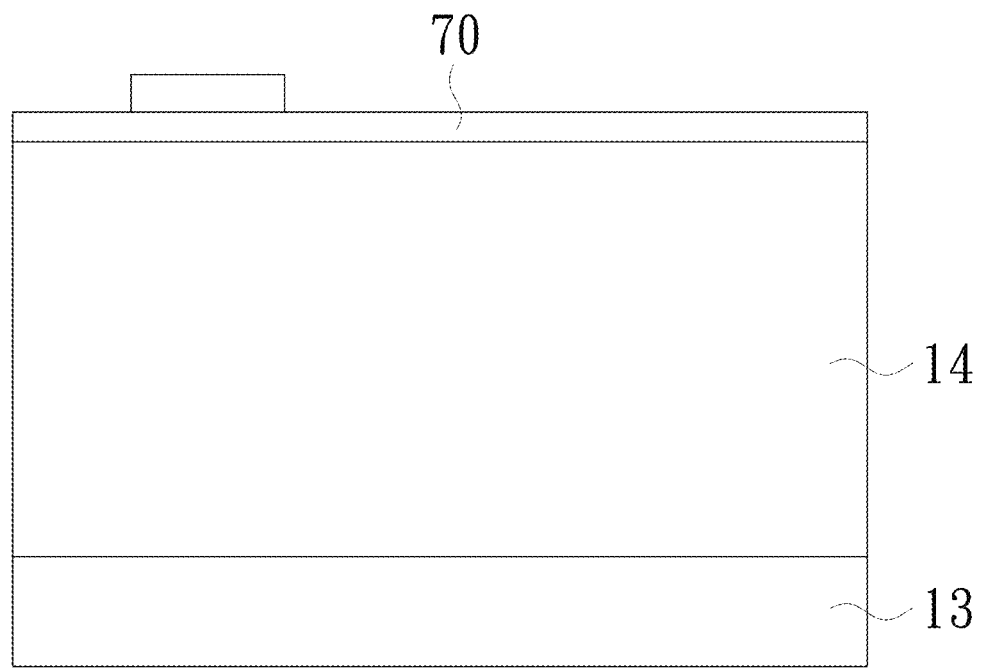
FIGS. 23A-23H demonstrate the method of making semiconductor device shown in FIGS. 21 and 22.
Figure 23B:
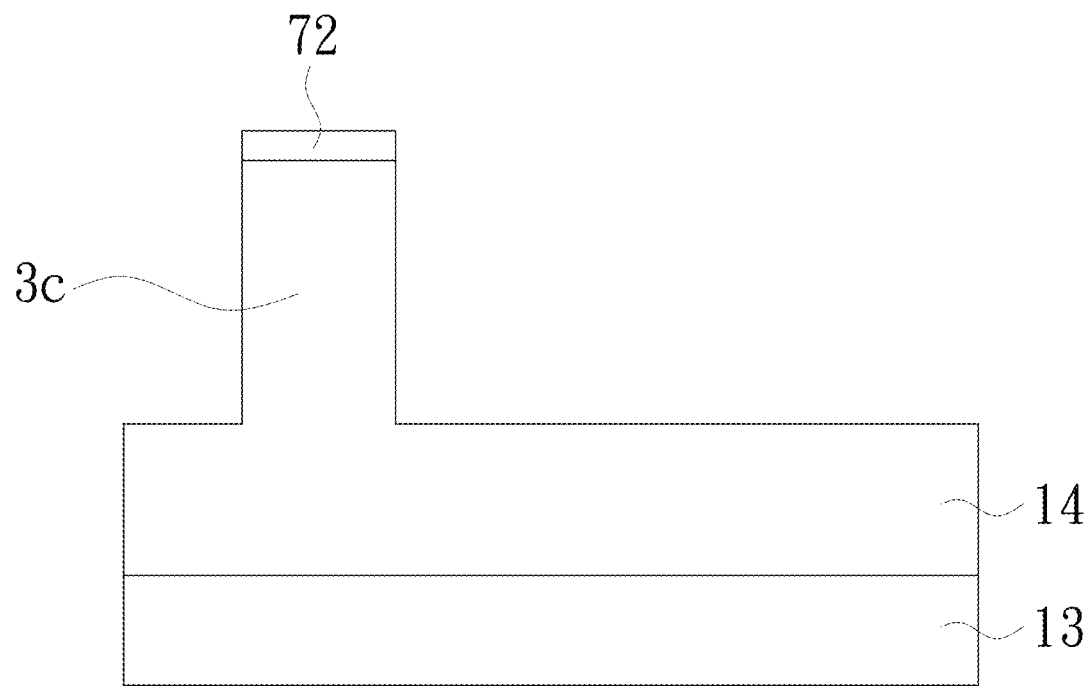
Figure 23C:
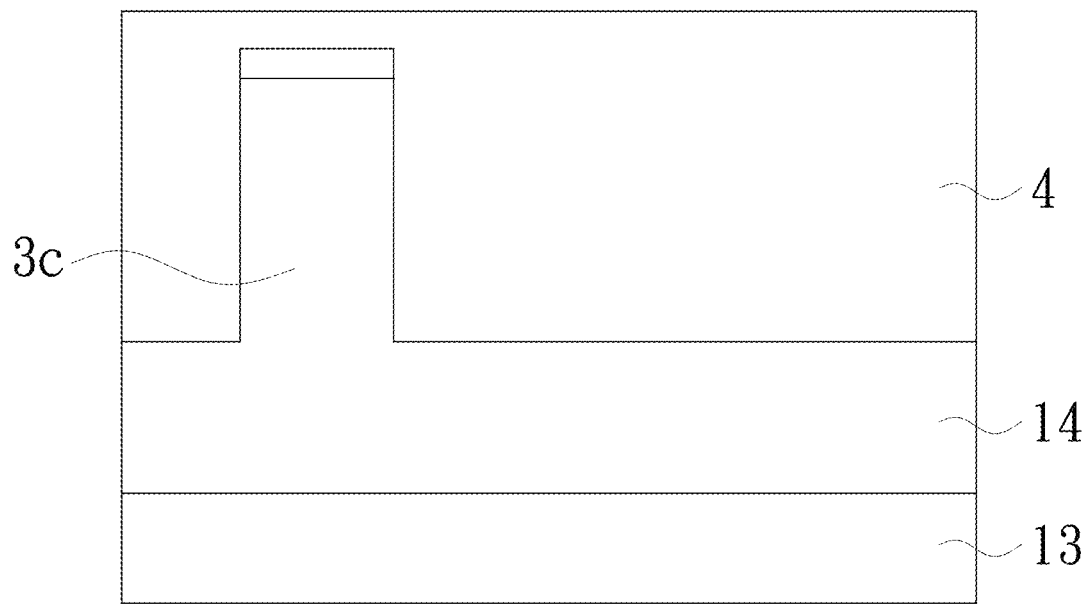
Figure 23D:
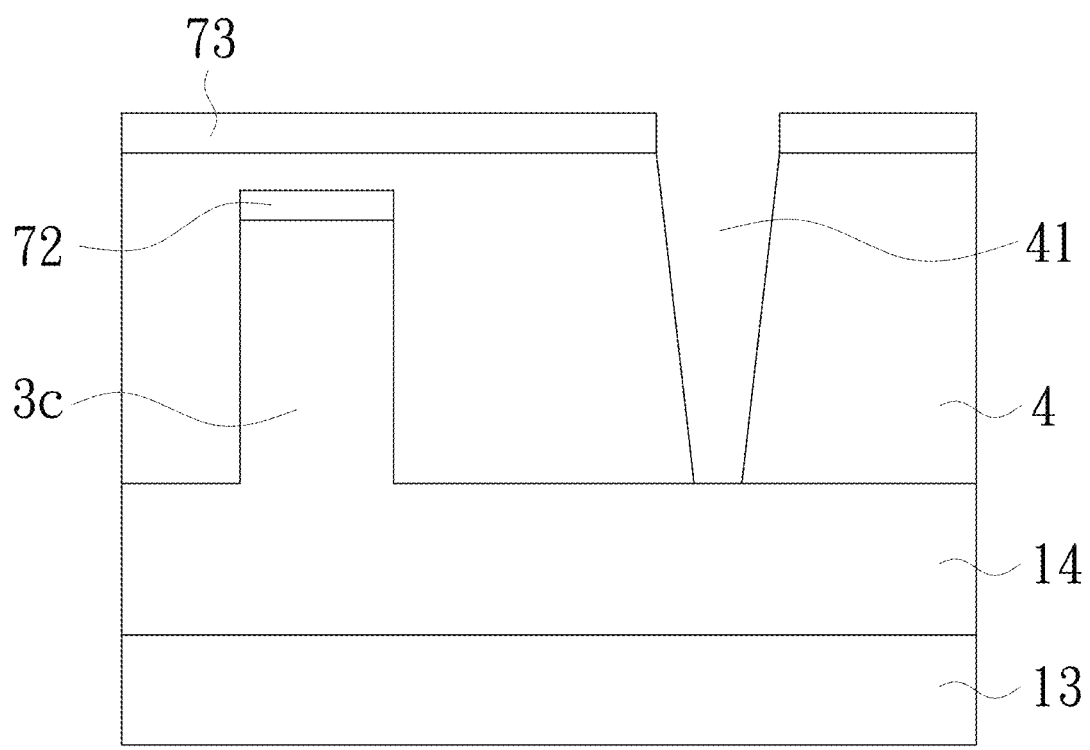
Figure 23E:
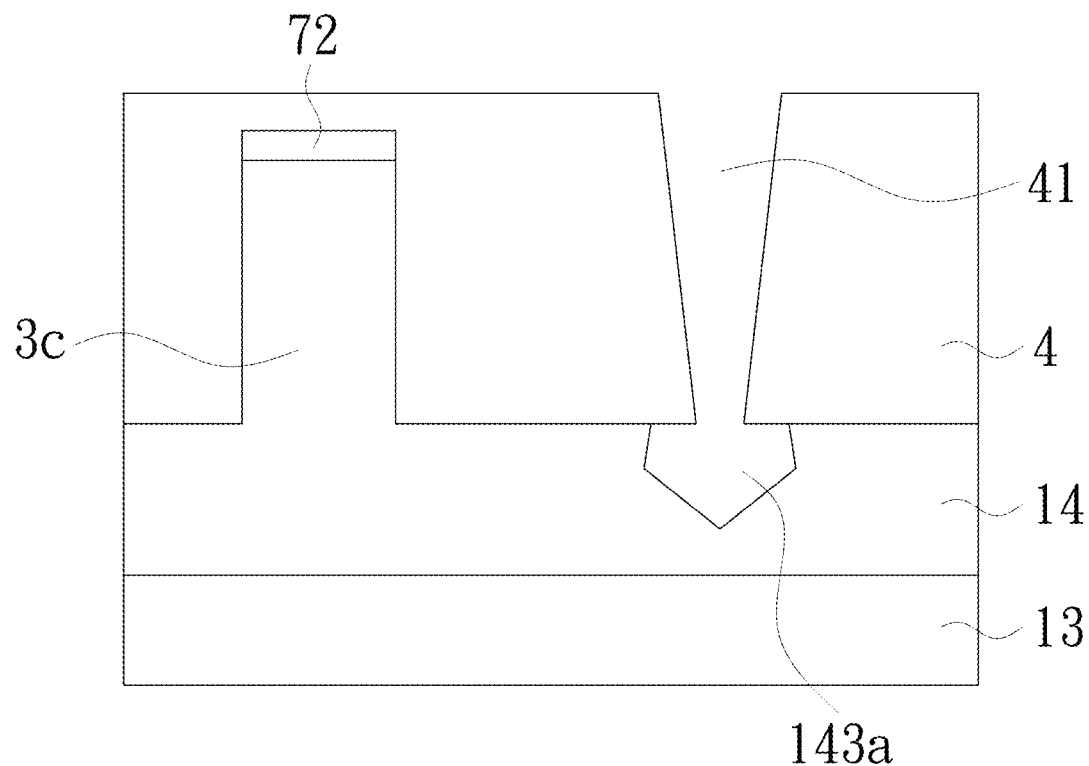
Figure 23F:
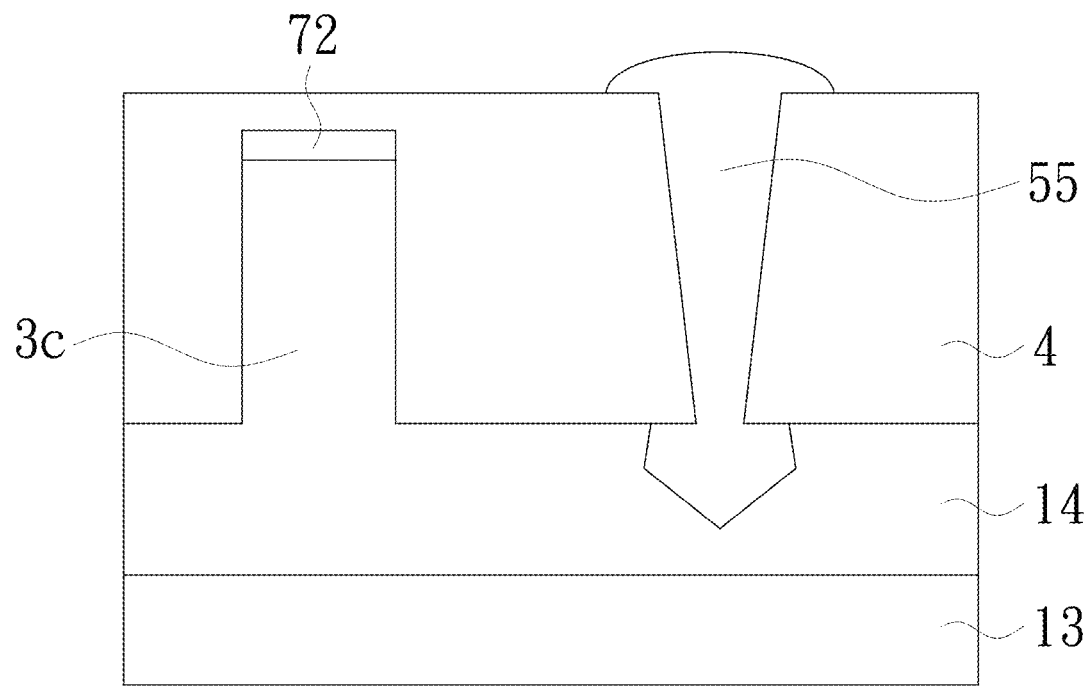
Figure 23G:
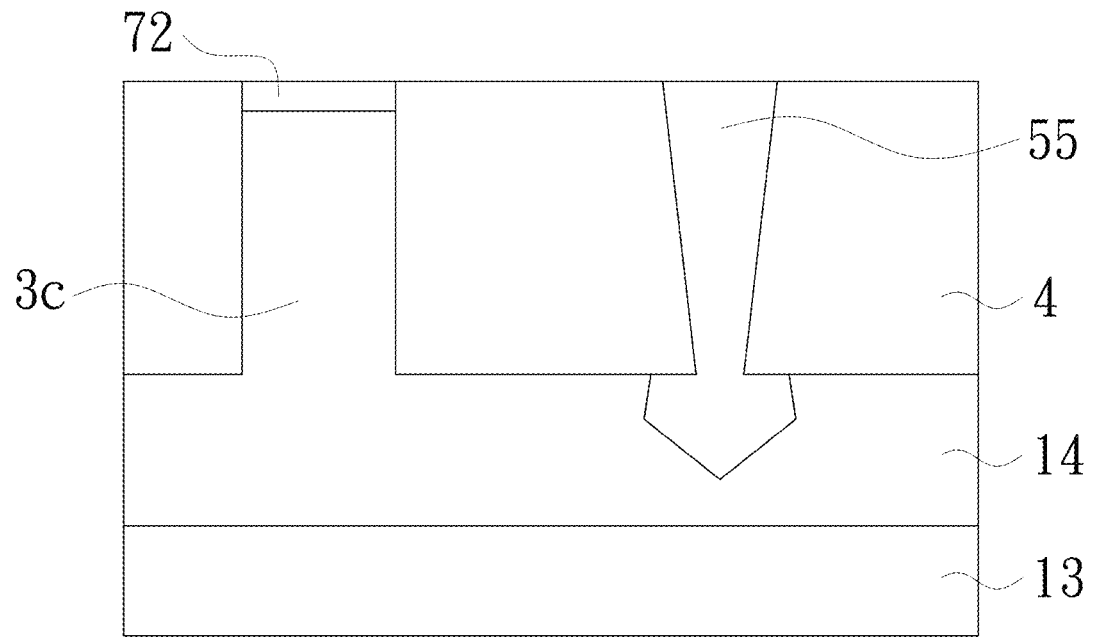
Figure 23H:
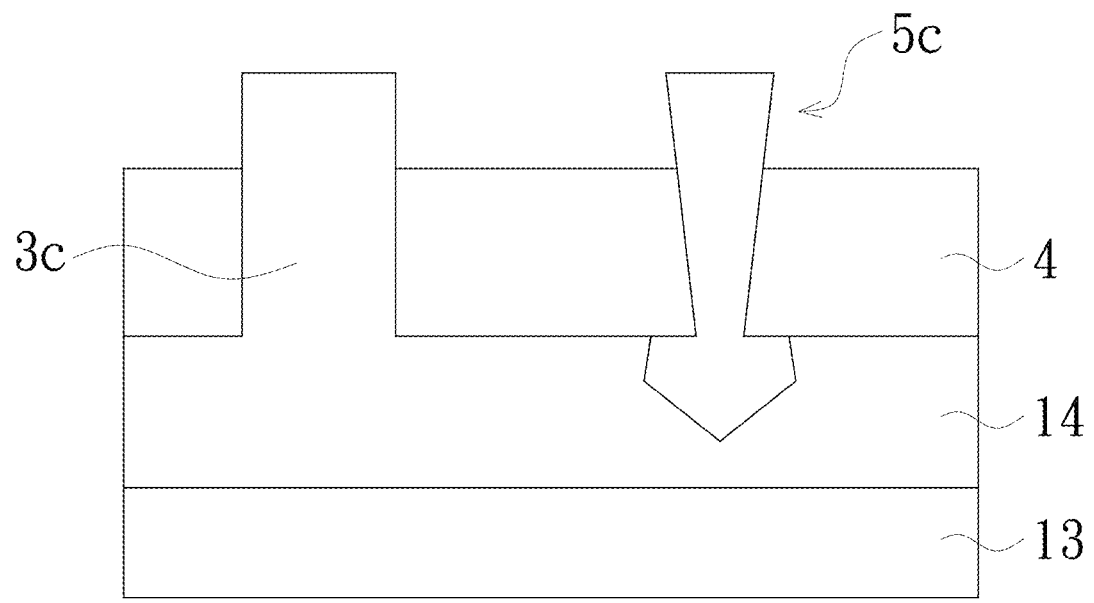

FIG. 22 is a cross-sectional view of another embodiment of semiconductor device 10*e*. In one embodiment, the semiconductor device 10*e* comprises a first fin 3*c* and a second fin 5*c* on the same substrate 13. In one embodiment, the first fin 3*c* comprises the same material as that of the buffer layer 14.

FIGS. 23A-23H demonstrates the method of making semiconductor device 10*e* shown in FIG. 22. The method includes steps of: (A) forming a SiO$_2$ layer 70 on the buffer layer 14 disposed on the substrate 13, and defining the hard mask 72 on the SiO$_2$ layer 70 by electron-beam lithography; (B) etching the buffer layer 14 on the region exposed from the hard mask 72 to form the fin 3*c*; (C) depositing SiO$_2$ by HDPCVD and executing a planarization process to obtain the insulating layer 4; (D) etching the insulating layer 4 with the mask 73 to form a trench 41 penetrating the insulating layer 4; (E) forming a diamond-shaped recess 143*a* on the buffer layer 14 below the trench 41 with wet treatment; (F) forming a second semiconductor layer 55 in the trench 41 and the recess 143*a* by MOVPE selective epitaxial growth; (G) polishing the top surface of the second semiconductor layer 55 and thus forming the second fin 5*c*; and (H) etching back the insulating layer 4 with HF dipping to expose the top portions of the first fin 3*c* and the second fin 5*c*.

Figure 24:
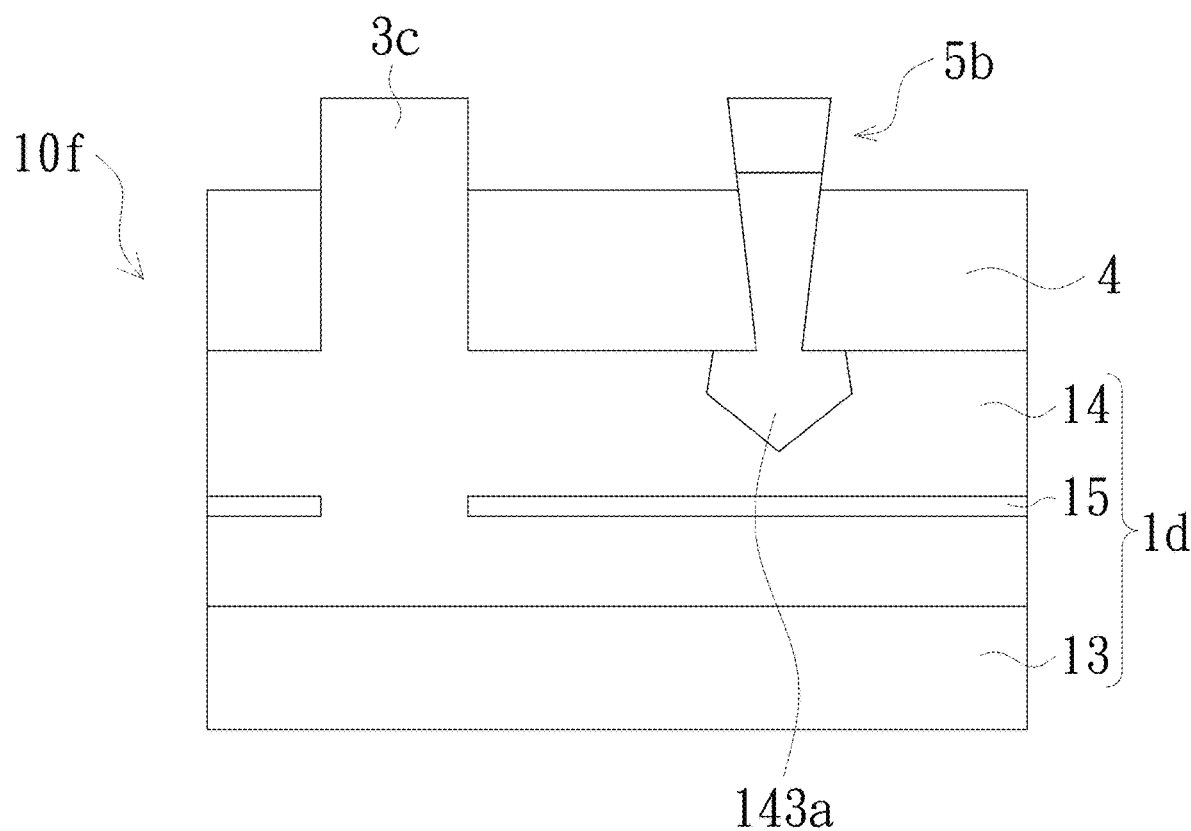
FIG. 24 is a cross-sectional view of another semiconductor device.

FIG. 24 is a cross-sectional view of another embodiment of semiconductor device 10*f*. In one embodiment, the first insulating layer 15 is in the buffer layer 14, below the recess 143*a* and is not overlapped with the first fin 3*c* in a vertical direction. The first insulating layer 15 comprises one conductivity reducing layer formed by implantation. The conductivity reducing layer comprises oxygen or nitrogen.

Figure 25A:
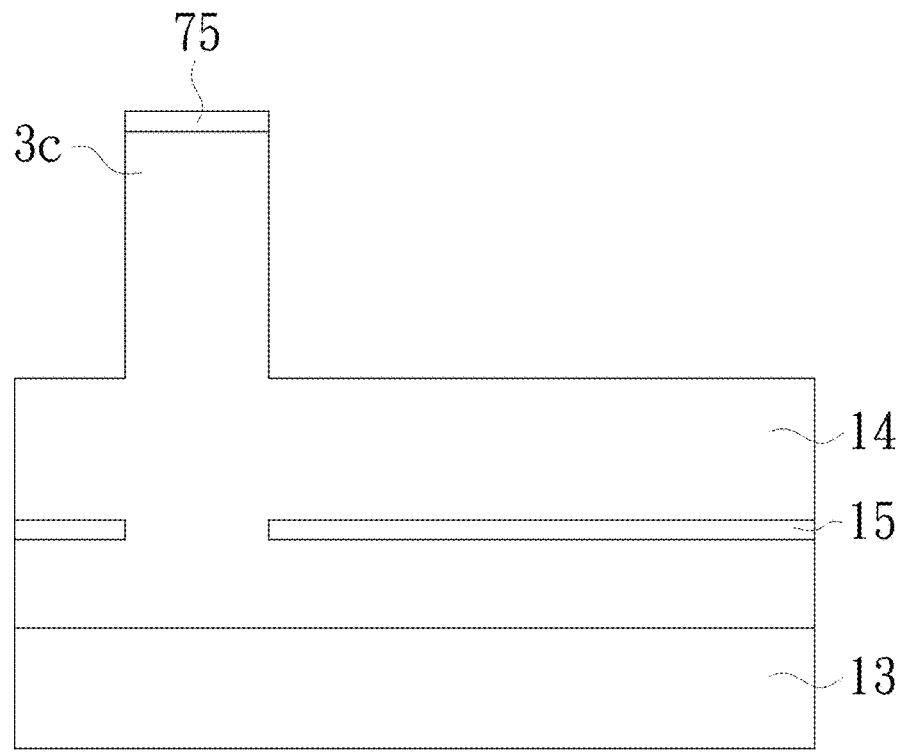
FIGS. 25A-25B demonstrates the method of making semiconductor device shown in FIG. 24.
Figure 25B:
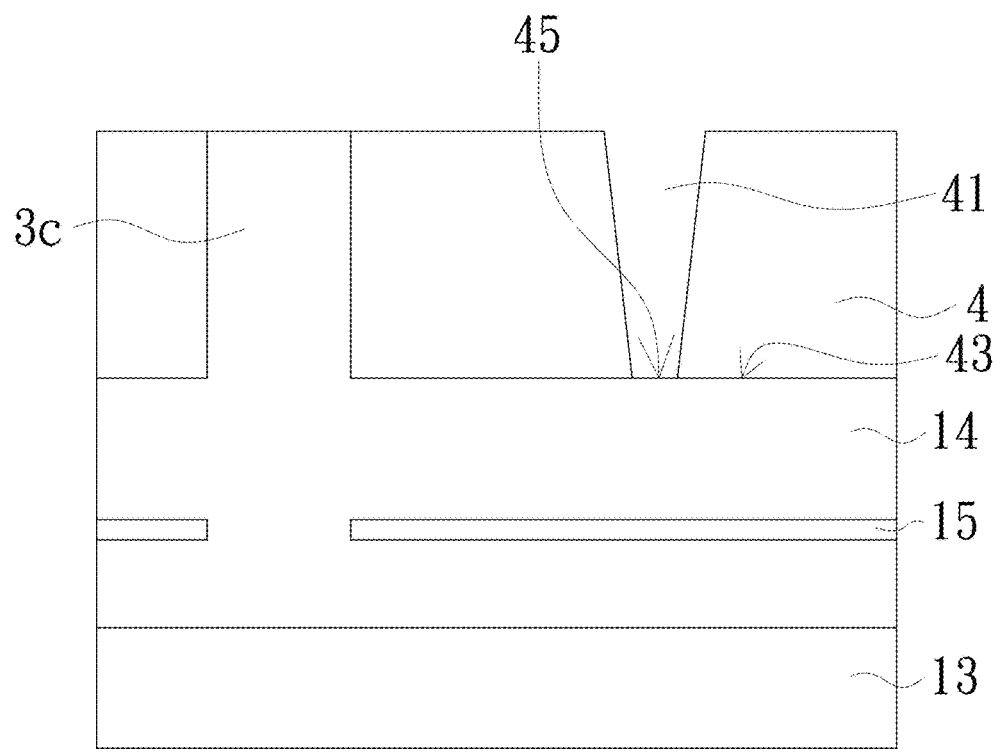

FIGS. 25A-25B demonstrate the method of making the semiconductor device 10*f* shown in FIG. 24. The method comprises steps of: (A) providing a mask 75 on the second fin 3*c*, implanting nitrogen and/or oxygen into the buffer layer 14 to form the first insulating layer 15 comprising the nitrogen and/or oxygen, wherein the first insulating layer 15 is not overlapped with the first fin 3*c* in a vertical direction; (B) forming the insulating layer 4 on the substrate 13, and forming a trench 41 penetrating the insulating layer 4 and thus the lower surface 43 of the insulating layer 4 having a first opening 45, wherein the method of forming the trench 41 is, but not limited to, by dry etching. The following steps are substantially the same as aforementioned.

FIG. 26 illustrates a stereoscopic view of the semiconductor device 10. The semiconductor device 10 comprises a PMOSFET 30 and an NMOSFET 50 on the same substrate 1. The semiconductor 10 device monolithically integrated a PMOSFET and an NMOSFET.

In summary, the present invention utilizes the selective epitaxial growth technique to directly integrate the Group III-V semiconductor with the highest electron mobility and the Group VI semiconductor such as SiGe or GeSn with the highest hole mobility side-to-side on the inexpensive Si substrate, and the heights of the NMOSFET transistor and the PMOSFET transistor are almost the same, so it is not only that the price is competitive, but also more in line with the principles and requirements of high-density integrated circuits than the conventional technology. In addition, the use of novel buffer layer such as InGaP, coupled with a specific group, such as SiGe or other Group VI film, effectively reduces defects and obtains a high-quality crystal Group III-V (such as InGaAs) active layer. The diffusion barrier layer has been proved to improve the cross-doping problems between Group III-V and VI materials. Furthermore, the use of a variation in the shape of the trench to create a defective structure may further assist in reducing defects in heterogeneous integration.

The foregoing and other technical aspects, features and utilities of the present invention will become apparent from the following detailed description of a preferred embodiment of the accompanying drawings. The directional terms mentioned in the following examples, for example: up, down, left, right, front or rear, etc., refer only to the directions of the additional figures. Accordingly, the use of the term terms is to be taken as illustrative and not intended to limit the present invention.

While the foregoing is intended to be considered as a preferred embodiment of the present invention, it is not intended to limit the scope of the invention as defined by the appended claims, but rather to the simple equivalents of the claims and the description of the invention and modifications, all falling within the scope of the present invention. Furthermore, it is not intended that any of the embodiments, or the claims, fall within the scope of the invention, as set forth in the appended claims, for all purposes or advantages of the invention. In addition, the abstract section and headings are only intended to assist in patent document search and are not intended to limit the scope of the invention. In addition, the terms "first" and "second" as used in this specification or the scope of the claims are merely used to designate the names of elements or to distinguish between different embodiments or ranges and are not intended to limit the number of elements in upper or lower limit.

What is claimed is:

1. A heterogeneously integrated semiconductor device, comprising:
   a substrate;
   a recess formed within the substrate;
   a first insulating layer on the substrate and comprising a trench connectedly adjacent to the recess; and
   a first semiconductor layer filled in the recess and the trench;
   wherein the first semiconductor layer has a top surface away from the substrate, and the first insulating layer has an upper surface away from the substrate and below the top surface.

2. The heterogeneously integrated semiconductor device according to claim 1, further comprising a second semiconductor layer on the first semiconductor layer, wherein the second semiconductor layer has an electron mobility higher than that of the first semiconductor layer.

3. The heterogeneously integrated semiconductor device according to claim 2, wherein the second semiconductor layer has an enemy band gap smaller than that of the first semiconductor layer.

4. The heterogeneously integrated semiconductor device according to claim 1, wherein the substrate comprises Si or Ge.

5. The heterogeneously integrated semiconductor device according to claim 1, wherein the first semiconductor layer physically contacts the first insulating layer.

6. The heterogeneously integrated semiconductor device according to claim 1, wherein the trench comprises a bottom opening connectedly adjacent to the recess and a top opening greater than the bottom opening.

7. The heterogeneously integrated semiconductor device according to claim 6, wherein the trench comprises an inner diameter gradually decreased from the top opening to the bottom opening.

8. The heterogeneously integrated semiconductor device according to claim 1, further comprising a second semiconductor layer on the first semiconductor layer, wherein the second semiconductor layer has a dislocation density less than that of the first semiconductor layer.

9. The heterogeneously integrated semiconductor device according to claim 1, wherein the substrate comprises a second insulating layer.

10. The heterogeneously integrated semiconductor device according to claim 9, wherein the second insulating layer comprises oxygen or nitrogen.

11. The heterogeneously integrated semiconductor device according to claim 1, wherein the first semiconductor layer comprises Group III element.

12. The heterogeneously integrated semiconductor device according to claim 11, wherein the first semiconductor layer comprises $(Al_xGa_{1-x})_yIn_{1-y}P$, and $0 \leq x \leq 1$, $0 \leq y \leq 1$.

13. The heterogeneously integrated semiconductor device according to claim 12, wherein $0=x$, $0 \leq y \leq 0.45$.

14. The heterogeneously integrated semiconductor device according to claim 11, wherein the amount of the Group III element gradually increases in a direction from the substrate toward the first insulating layer.

15. The heterogeneously integrated semiconductor device according to claim 1, further comprising a second semiconductor layer on the first semiconductor layer, wherein the second semiconductor layer comprises Group III element.

16. The heterogeneously integrated semiconductor device according to claim 15, wherein the second semiconductor layer comprises $(Al_xGa_{1-x})_yIn_{1-y}As$, and $0=x$, $0 \leq y \leq 0.8$.

17. The heterogeneously integrated semiconductor device according to claim 15, wherein the amount of the Group III element gradually increases in a direction from the substrate toward the first insulating layer.

18. The heterogeneously integrated semiconductor device according to claim 1, wherein the first insulating layer has a first opening with a first width and the substrate has a second opening with a second width larger than the first width.

19. The heterogeneously integrated semiconductor device according to claim 18, further comprising a second semiconductor layer on the first semiconductor layer, wherein the second semiconductor layer has a top surface with a third width larger than the first width.

20. The heterogeneously integrated semiconductor device according to claim 1, wherein the substrate has a base layer and a buffer layer having an electron mobility higher than that of the base layer.

* * * * *